United States Patent
Crofts

(10) Patent No.: US 8,207,773 B2
(45) Date of Patent: Jun. 26, 2012

(54) PULSE-WIDTH MODULATION (PWM) WITH INDEPENDENTLY ADJUSTABLE DUTY CYCLE AND FREQUENCY USING TWO ADJUSTABLE DELAYS

(75) Inventor: Andrew Harvey Crofts, Coppell, TX (US)

(73) Assignee: Linear Technology Corporation, Milpitas, CA (US)

( * ) Notice: Subject to any disclaimer, the term of this patent is extended or adjusted under 35 U.S.C. 154(b) by 38 days.

(21) Appl. No.: 12/863,699

(22) PCT Filed: Jul. 17, 2009

(86) PCT No.: PCT/US2009/051012
§ 371 (c)(1),
(2), (4) Date: Jul. 20, 2010

(87) PCT Pub. No.: WO2010/082954
PCT Pub. Date: Jul. 22, 2010

(65) Prior Publication Data
US 2010/0289547 A1 Nov. 18, 2010

Related U.S. Application Data

(60) Provisional application No. 61/144,872, filed on Jan. 15, 2009, provisional application No. 61/147,843, filed on Jan. 28, 2009.

(51) Int. Cl.
*H03K 3/017* (2006.01)
*H03K 5/04* (2006.01)
*H03K 7/08* (2006.01)

(52) U.S. Cl. .................... 327/175; 327/172; 327/173
(58) Field of Classification Search .............. 327/172, 327/173, 175
See application file for complete search history.

(56) References Cited

U.S. PATENT DOCUMENTS

| | | | |
|---|---|---|---|
| 5,198,785 A | 3/1993 | Jordan | |
| 5,640,131 A | 6/1997 | Kawasaki et al. | |
| 6,194,929 B1 | 2/2001 | Drost | |
| 6,307,412 B1 * | 10/2001 | Kim et al. | 327/165 |
| 6,498,617 B1 | 12/2002 | Ishida et al. | |
| 7,259,474 B2 | 8/2007 | Blanc | |
| 7,269,217 B2 | 9/2007 | Leith et al. | |
| 7,301,417 B2 | 11/2007 | Shinohara | |
| 7,355,472 B2 | 4/2008 | Kranz | |
| 7,388,358 B2 | 6/2008 | Duan | |
| 7,425,864 B2 | 9/2008 | Risbo | |

* cited by examiner

*Primary Examiner* — John Poos
(74) *Attorney, Agent, or Firm* — McDermott Will & Emery LLP

(57) ABSTRACT

A pulse width modulation circuit may generate an adjustable output signal that periodically transitions between a first and a second state with an adjustable duty cycle. A first pulse generator circuit may be configured to generate a first pulse signal that periodically transitions at an adjustable delay with respect to a periodic reference signal. A second pulse generator circuit may be configured to generate a second pulse signal that periodically transitions at an adjustable delay with respect to the periodic reference signal. A logic circuit may be configured to generate the adjustable output signal based on both the first and the second pulse signals.

24 Claims, 19 Drawing Sheets

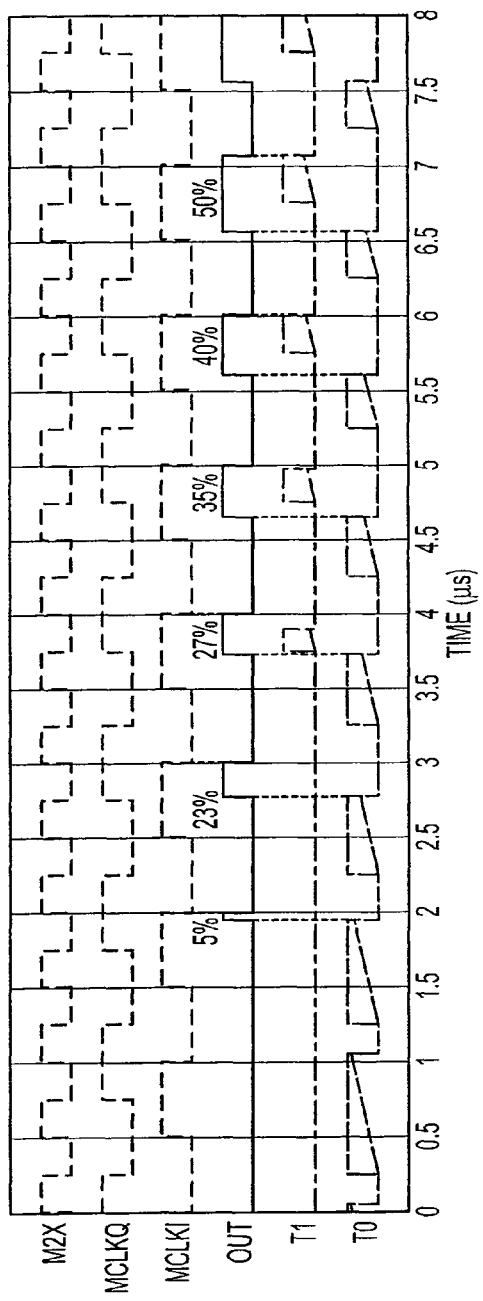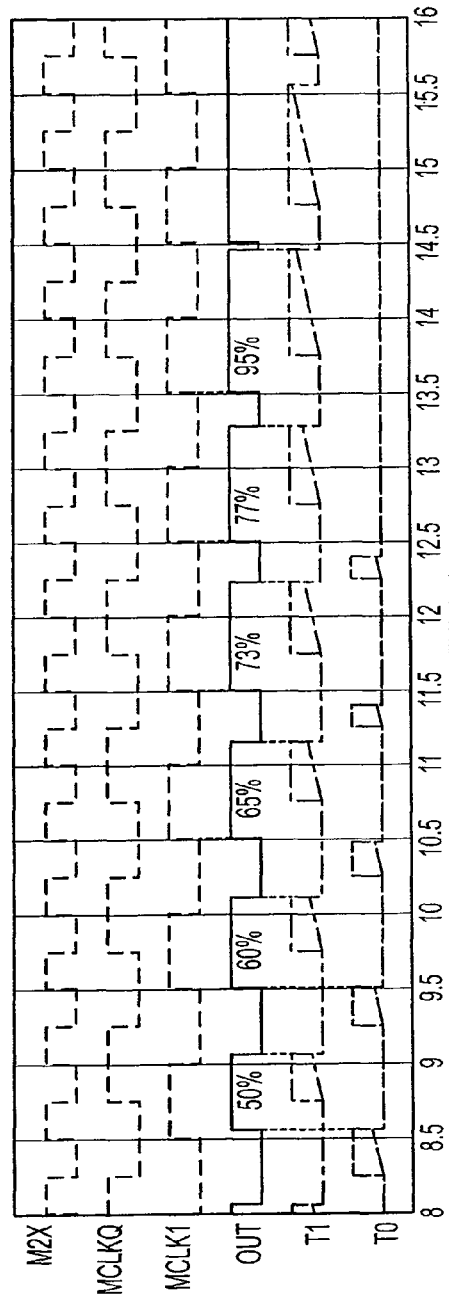

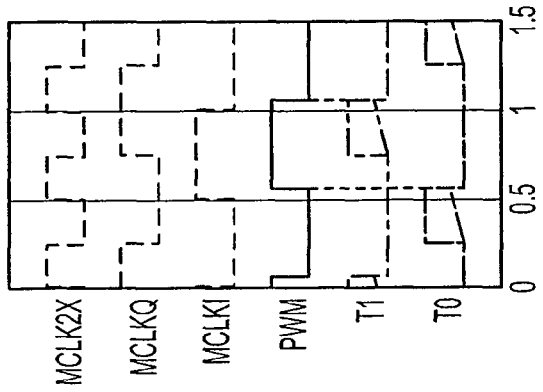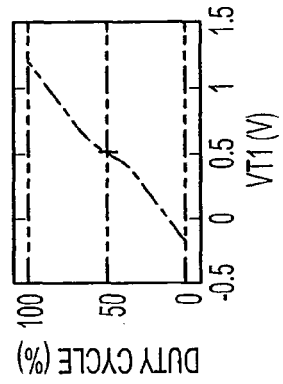
FIG. 9c    FIG. 10c
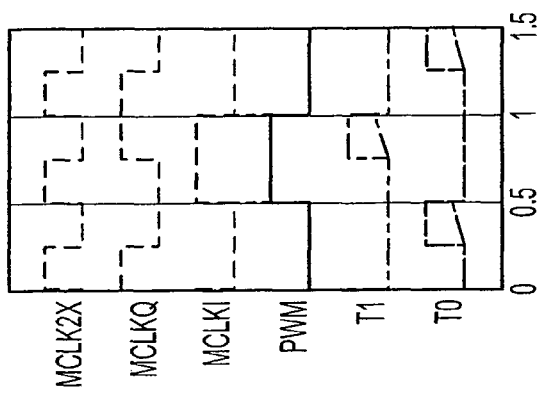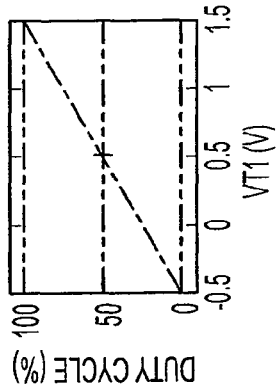
FIG. 9b    FIG. 10b
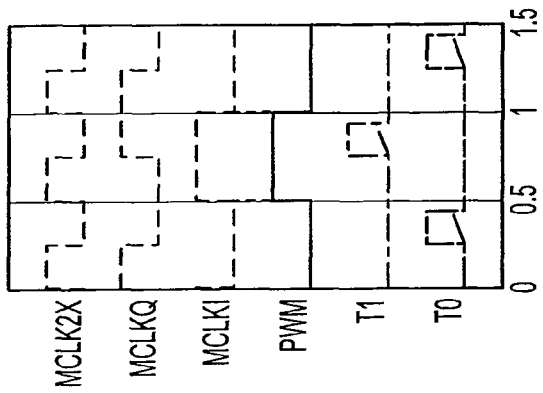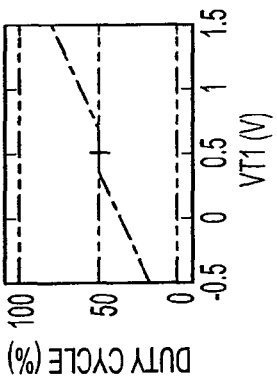
FIG. 9a    FIG. 10a

PULSE-WIDTH MODULATION (PWM) WITH INDEPENDENTLY ADJUSTABLE DUTY CYCLE AND FREQUENCY USING TWO ADJUSTABLE DELAYS

CROSS-REFERENCE TO RELATED APPLICATION(S)

This application is a U.S. National Phase under 35 U.S.C. §371 of International Application No. PCT/US2009/051012, filed on Jul. 17, 2009, which is based upon and claims priority to: U.S. Provisional Patent Application No. 61/144,872, entitled "Generating a Pulse-Width Modulation ("PVM") Train," filed Jan. 15, 2009; U.S. Provisional Patent Application No. 61/147,843, entitled "Pulse-Width Modulation (PVM) Using Two Independently-Operated Delay Circuits," filed Jan. 28, 2009; and PCT/US2009/051012, entitled Pulse-Width Modulation (PWM) With Independently Adjustable Duty Cycle and Frequency Using Two Adjustable Delays," filed Jul. 17, 2009. The entire content of each of these applications is incorporated herein by reference.

BACKGROUND

1. Technical Field

This disclosure relates to circuits for generating pulse-width modulation ("PWM") signals, including PWM signals that have an independently adjustable duty cycle and frequency.

2. Description of Related Art

PWM circuits may be built around a periodic sawtooth or triangular signal. The sawtooth or triangular signal may be compared against a constant control signal. The result may be a periodic pulse having a duty cycle that is dependent upon the level of the constant control signal. The frequency of the signal may also be changed to cause a corresponding change in the frequency of the PWM signal.

Circuits of this type, however, may be limited in the minimum pulse width which the circuit can controllably and stably generate. This may be due to propagation delays in the circuit and other factors. Changes in the frequency of the analog sawtooth or triangular signal can also affect its wave shape. This may cause corresponding changes in the duty cycle of the PWM signal, even though the level of the constant control signal does not change.

SUMMARY

A pulse width modulation circuit may generate an adjustable output signal that periodically transitions between a first and a second state with an adjustable duty cycle. A first pulse generator circuit may be configured to generate a first pulse signal that periodically transitions at an adjustable delay with respect to a periodic reference signal. A second pulse generator circuit may be configured to generate a second pulse signal that periodically transitions at an adjustable delay with respect to the periodic reference signal. A logic circuit may be configured to generate the adjustable output signal based on both the first and the second pulse signals.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same numeral appears in different drawings, it is intended to refer to the same or like components or steps.

FIG. 5($b$) illustrates an adjustable output signal (OUT) that periodically transitions between two states with a 95% duty cycle, a first pulse signal (T0), a second pulse signal (T1), and a periodic reference signal (MCLK), wherein α (defined below) is 0.5.

FIG. 6 illustrates an adjustable output signal (OUT) that periodically transitions between two states with a varying duty cycle, a first pulse signal (T0), a second pulse signal (T1) that does not overlap with the first pulse signal (T0), a double frequency periodic reference signal (M2X), and two periodic quadrature reference signals (MCLKQ, and MCLKI), wherein α (defined below) is 1.25.

FIGS. 9($a$), 9($b$), and 9($c$) illustrate various signals in the circuit illustrated in FIG. 7 with an α (defined below) of 0.75, 1.00, and 1.25, respectively.

FIGS. 10($a$), 10($b$), and 10($c$) illustrate the duty cycle of the adjustable output signal (OUT) in FIG. 7 at various adjustable pulse width control signal ($V_{T1}$) values and with an α (defined below) of 0.75, 1.00, and 1.25, respectively.

DETAILED DESCRIPTION OF ILLUSTRATIVE EMBODIMENTS

Illustrative embodiments are now discussed. Other embodiments may be used in addition or instead. Details that may be apparent or unnecessary may be omitted to save space or for a more effective presentation. Conversely, some embodiments may be practiced without all of the details that are disclosed.

The following nomenclature is used in this disclosure:

OUT—an adjustable output signal that periodically transitions between a first and a second state with an adjustable duty cycle, also referred to herein as a pulse-width modulated ("PWM") signal.

MCLK—a periodic reference signal, also referred to herein as a clock or master clock.

$T_M$—the period (1/frequency) of the periodic reference signal MCLK. The adjustable output signal OUT may have the same period.

$t_1$—an amount of time (or time delay) that defines the falling edge of the adjustable output signal OUT with respect to a transition of MCLK. As $t_1$ increases, it may extends the time that OUT=1, thus pushing out the falling edge of OUT.

$t_0$—an amount of time (or time delay) that defines the rising edge of the adjustable output signal OUT with respect to a transition of MCLK. As $t_0$ increases, it may extends the time that OUT=0, thus pushing out the rising edge of OUT.

T0—a first pulse signal that periodically transitions at an adjustable delay with respect to the periodic reference signal, also referred to herein as a logic signal with a pulse width equal to $t_0$. It may be set high (active) some time before the rising edge of the adjustable output signal OUT so that $t_0$ may control that edge.

T1—a second pulse signal that periodically transitions at an adjustable delay with respect to the periodic reference signal, also referred to herein as a logic signal with a pulse width equal to $t_1$. It may be set high (active) some time before the falling edge of the adjustable output signal OUT so that $t_1$ may control that edge.

α—a factor that relates the time length of $t_1$ and $t_0$ to the period of the periodic reference signal. It may set limits for designs that function as intended.

$V_{T0}$—a first adjustable pulse width control signal that may be a control voltage to either an adjustable delay circuit or an adjustable clock circuit that determines $t_0$.

$V_{T1}$—a second adjustable pulse width control signal that may be a control voltage to either an adjustable delay circuit or an adjustable clock circuit that determines $t_1$.

$V_{CM}$—a constant reference signal that may be equal to half of the sum of the values of $V_{T1}$ and $V_{T0}$.

Figure 1:
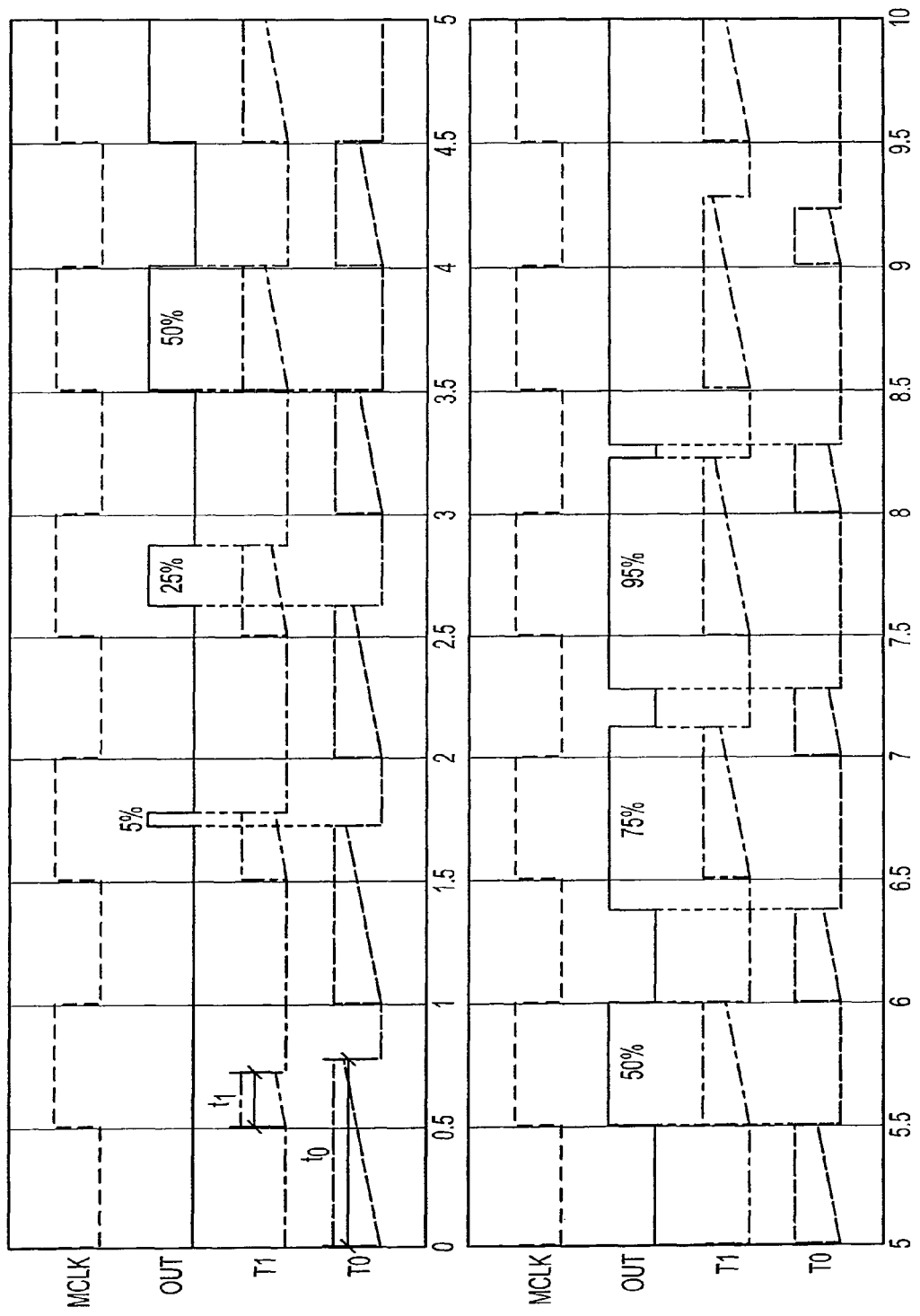
FIG. 1 illustrates an adjustable output signal (OUT) that periodically transitions between two states with a varying duty cycle, a first pulse signal (T0), a second pulse signal (T1), and a periodic reference signal (MCLK).

FIG. 1 illustrates an adjustable output signal (OUT) that periodically transitions between two states with a varying duty cycle, a first pulse signal (T0), a second pulse signal (T1), and a periodic reference signal (MCLK). Such an adjustable output signal (OUT) is commonly referred to as a pulse-width modulated ("PWM") signal and is so referred to herein.

OUT may be generated with a stable duty cycle that is very nearly 0% or 100%, without being limited by a comparator or other propagation delays. OUT may also be varied over a wide range of frequencies, while maintaining a constant, selected duty cycle.

As illustrated in FIG. 1, complementary adjustable delays T0 and T1 may be configured to control the rising and falling edges of OUT. The rising and falling edges of each adjustable delay T0 and T1 may be controlled independently. There may be no propagation delay limitation to the generation of very low (near 0%) or very high (near 100%) duty cycles in OUT. The T0 and T1 edges may be adjustably pushed close together and may even overlap to completely eliminate transitions in OUT (i.e., 0% or 100% duty cycle).

As also illustrated in FIG. 1, The pulse widths of T1 and T0, namely $t_1$ and $t_0$, respectively, may be configured to control the falling and rising edges of OUT. $t_1$ and $t_0$ may be complementary so that, as $t_1$ increases, $t_0$ decreases. The falling edge of T0 may determine the rising edge of OUT (i.e. T0 extends OUT=0), and the falling edge of T1 may determine the falling edge of OUT (i.e. T1 extends OUT=1). Different relationships between the edges of OUT and T1 and/or T0 may be used instead.

This type of pulse-width modulation may be called dual-edge PWM because both the rising and falling edges of OUT may be varied with respect to the periodic reference signal MCLK, which may be a clock signal.

For T1 to control OUT's falling edge, T1 may be active (i.e., $t_1$ may be started) some amount of time before the falling edge of OUT is to happen. Likewise, T0 may be active (i.e., $t_0$ may start) some amount of time before OUT's rising edge is to happen.

FIG. 1 illustrates a simple way to synchronize these signals. T1 may be triggered on the rising edge of the periodic reference signal MCLK, and T0 may be triggered on the falling edge of the periodic reference signal MCLK. Different relationships between edges of MCLK and the edges of T0 and/or T1 may be used instead.

Figure 2A:
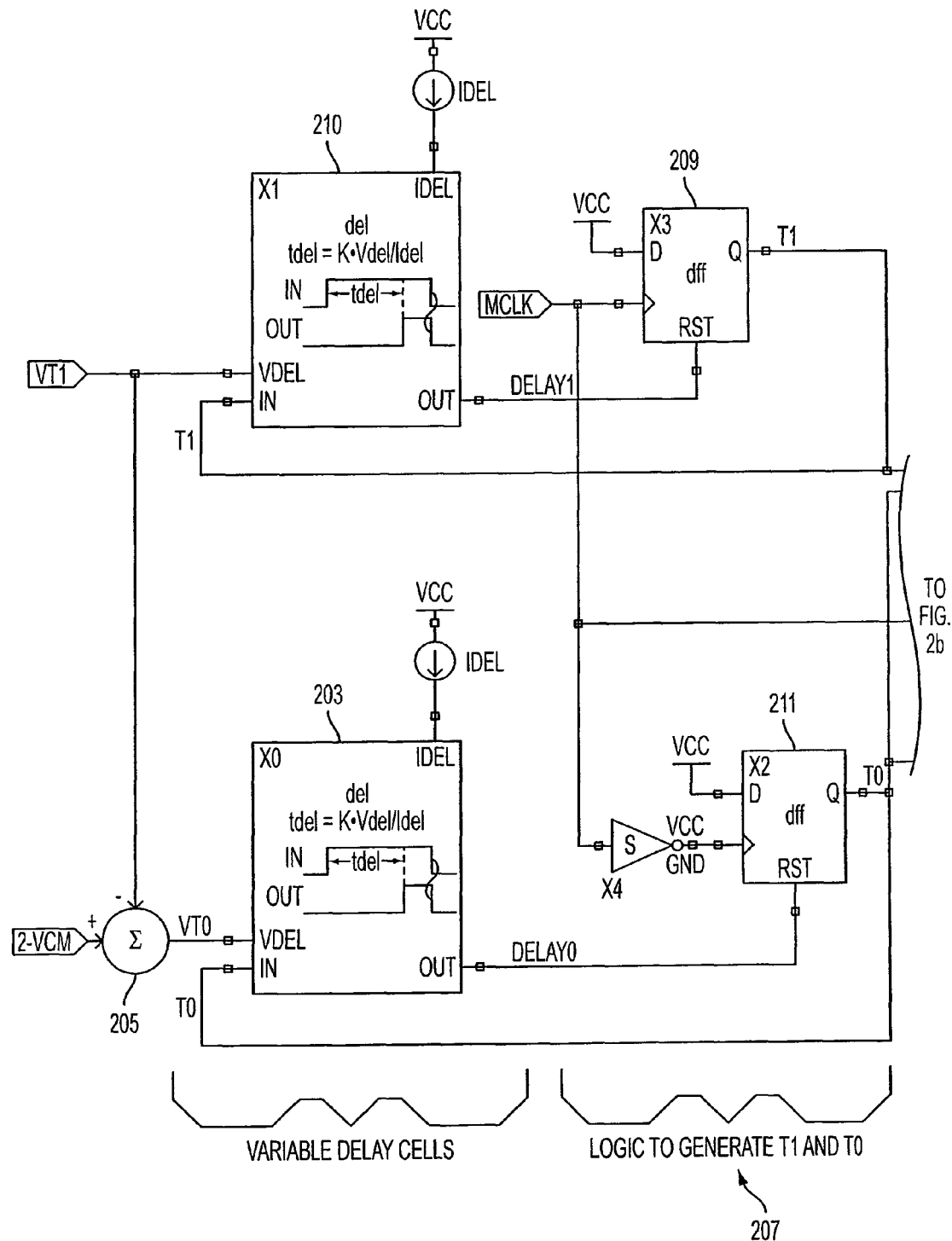
FIG. 2 illustrates a pulse-width modulation circuit that generates an adjustable output signal (OUT) that periodically transitions between two states with an adjustable duty cycle.
Figure 2B:
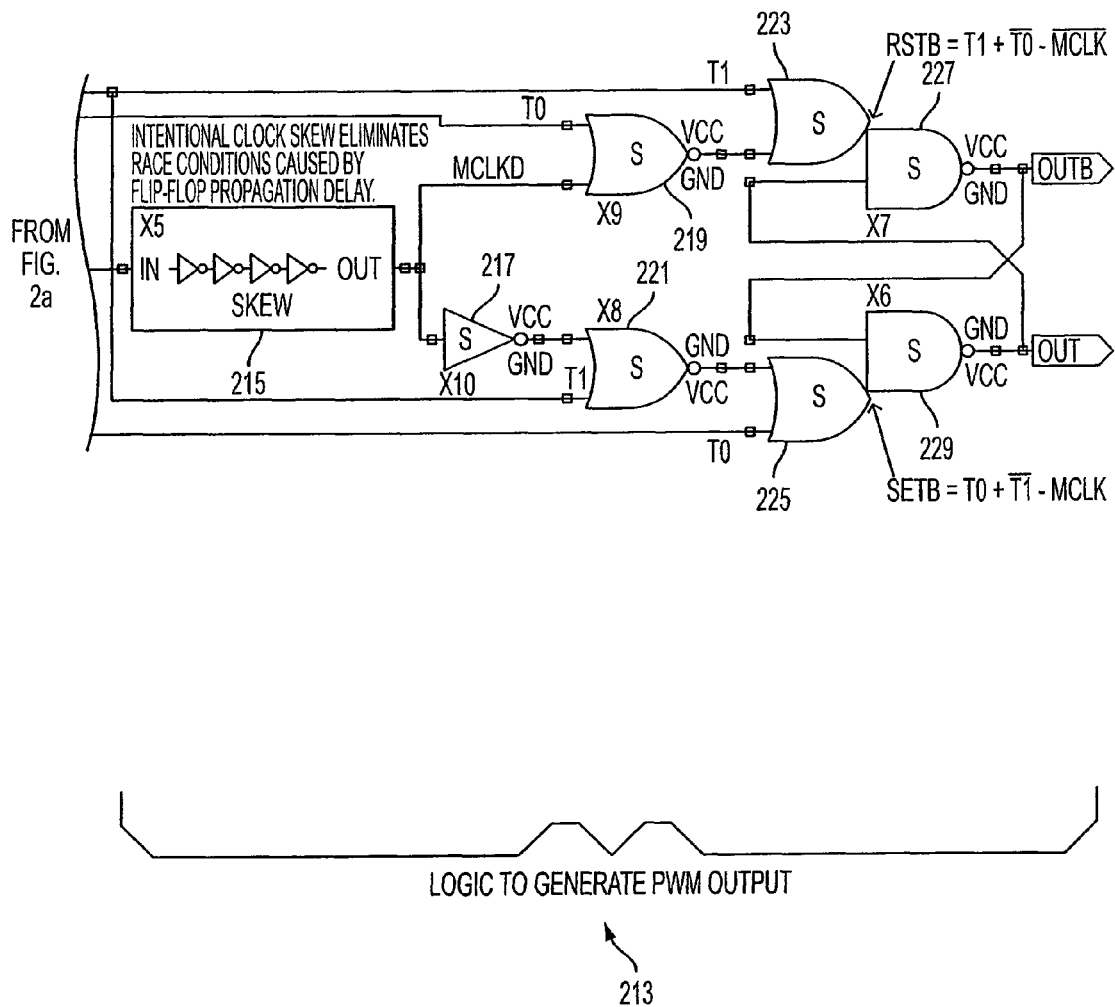

FIG. 2 illustrates a pulse-width modulation circuit that generates an adjustable output signal (OUT) that periodically transitions between two states with an adjustable duty cycle. The circuit in FIG. 2 may be configured to generate the signals illustrated in FIG. 1 or signals of a different type. Similarly, the signals illustrated in FIG. 1 may be generated by a circuit different from the circuit illustrated in FIG. 2.

As illustrated in FIG. 2, each of two adjustable delay circuits 201 and 203 may be configured to generate an adjustable delay signal at its OUT that tracks an input signal at its IN that is delayed in time based on the magnitude of an adjustable pulse width control signal $V_{T0}$ or $V_{T1}$. The adjustable delay provided by each adjustable delay circuit 201 and 203 may be coarsely set by an adjustable bias current IDEL and may be finely set by the adjustable pulse width control signals $V_{T0}$ or $V_{T1}$.

$V_{T0}$ may be generated from $V_{T1}$ by a generator circuit, such as by a subtraction circuit 205 that causes $V_{T0}$ to equal $2 \cdot V_{CM} - V_{T1}$. $V_{CM}$ may be a common-mode voltage such that $V_{CM} = \frac{1}{2} \cdot (V_{T0} + V_{T1})$. The condition $V_{T0} = V_{T1} = V_{CM}$ may result in 50% duty cycle.

A logic section 207 may be configured with D memories 209 and 211 to generate T1 and T0 from the periodic referenced signal MCLK. On rising MCLK edges, T1 may go high and may begin the $t_1$ delay. On falling MCLK edges, T0 may go high and may begin the $t_0$ delay.

A second logic section 213 may include delay gates 215, an inverter 217, NOR gates 219 and 221, OR gates 223 and 225, and NAND gates 227 and 229 configured to cause OUT to transition based on T1, T0, and MCLK, as illustrated in FIG. 1.

As illustrated in FIG. 1, a 0% duty cycle may result when $t_0$ is large enough to push T0's falling edge past T1's falling edge, thus preventing T1 from setting OUT=1. A 100% duty cycle may result when a large value for $t_1$ pushes T1's falling edge past T0's falling edge. The logic for OUT may be configured to effectuate these results, as illustrated in FIG. 2.

The end of the $t_1$ delay (i.e. T1 falling) may reset OUT=0 if:

$\overline{T1} \cdot MCLK = 1$ (duty cycle ≤ 50%) or $\overline{T1} \cdot T0 = 1$ (50% ≤ duty cycle < 100%)

T1=0 may not affect OUT if T1 falls while MCLK=0 and T0=0 because that may occur for 100% duty cycle.

The end of the $t_0$ delay (i.e. T0 falling) may set OUT=1 if:

$$\overline{T0} \cdot \overline{MCLK} = 1 \text{(duty cycle} \geq 50\%) \text{ or}$$

$$\overline{T0} \cdot T1 = 1 \text{(0\%} < \text{duty cycle} \leq 50\%)$$

T0=0 may not affect OUT if T0 falls while MCLK=1 and T1=0 because that may occur for 0% duty cycle.

The $t_0$ and $t_1$ variable delays may be inversely related in a linear fashion. In this instance, their sum may be a constant. This assumption of linearity is not required, but is the basis for the illustrative implementations discussed herein.

A parameter $\alpha$ may be defined as a constant that relates the period of the periodic reference signal to the time delays $t_0$ and $t_1$.

$$t_0 + t_1 = \alpha \cdot T_M$$

In FIG. 1, $\alpha = 1$.

Though the logic signals T1 and T0 may be generated independently, the two time delays $t_1$ and $t_0$ may not be independent of each other, as indicated above. In certain embodiments, for example, $t_1$ may be independent (the control) and $t_0$ may be dependent upon $t_1$ according to the equation immediately above. This illustrative relationship is assumed in the remaining portions of this disclosure.

The duty cycle of the adjustable output signal OUT may therefore be calculated as follows:

$$\text{Dutycycle} \equiv \frac{t_{ON}}{T_M},$$

where $t_{ON}$ is the positive pulse width of OUT $$\text{Dutycycle} = \frac{\frac{T_M}{2} + t_1 - t_0}{T_M}, \text{ where } \frac{T_M}{2}$$

is the delay between the T1 and T0 rising edges $$\text{Dutycycle} = \frac{1}{2} + \frac{t_1 - (\alpha \cdot T_M - t_1)}{T_M}$$

$$\text{Dutycycle} = \frac{1}{2} - \alpha + 2 \cdot \frac{t_1}{T_M}$$

As $\alpha$ increases above 1, the required delays may get longer. The longest $t_1$ delay may be at 100% duty cycle and may be less than the period of the periodic reference signal:

$$t_1 = \frac{T_M}{2} \cdot \left(\text{dutycycle} + \alpha - \frac{1}{2}\right)$$

$$t_{1,max} = \frac{T_M}{2} \cdot \left(100\% + \alpha - \frac{1}{2}\right) = \frac{T_M}{2} \cdot \left(\alpha + \frac{1}{2}\right) < T_M$$

$$\alpha < 1.5$$

At the other extreme, the minimum $t_1$ delay at 0% duty cycle may be greater than zero:

$$t_{1,min} = \frac{T_M}{2} \cdot \left(0\% + \alpha - \frac{1}{2}\right) = \frac{T_M}{2} \cdot \left(\alpha - \frac{1}{2}\right) > 0 \text{ seconds}$$

$$\alpha > 0.5$$

Therefore:

$$0.5 < \alpha < 1.5$$

These limits are based on the assumption of a linear relationship between $t_1$ and $t_0$ and on the chosen phase relationship between T1, T0 and MCLK. The $t_1$ and $t_0$ relationship may instead be nonlinear, and/or T1 and T0 may be activated at different times with respect to MCLK. If either occurs, the limits on $\alpha$ may be different.

The adjustable delay circuits 201 and 203 may be tuned to match the period of the periodic reference signal MCLK, with an allowance of ±50%. If the frequency of the periodic reference signal MCLK doubles, for example, then $t_1$ and $t_0$ may be cut in half to maintain a constant $\alpha$.

The periodic reference signal MCLK may be generated on the same integrated circuit as the adjustable output signal OUT. The same type of adjustable delay circuits may be used to generate the periodic reference signal, and the same biasing may be used to tune both adjustable delay circuits.

If the periodic reference signal is instead an input (i.e., generated off-chip) and its period needs to be varied by more than ±50%, the adjustable delay circuits may be tuned by a phase-locked loop (PLL), frequency-to-voltage converter, or by other methods known to those skilled in the art.

The circuit in FIG. 2 may be able to generate very small positive or negative pulses in a PWM waveform (i.e. duty cycles very near 0% or 100%), such as OUT. As shown in the analysis above, the adjustable delay circuits 201 and 203 may be tuned to match the desired output frequency. Therefore, the frequency range may be limited by the amount of "pullability" (tuning range) of the adjustable delay circuits 201 and 203.

Figure 3A:
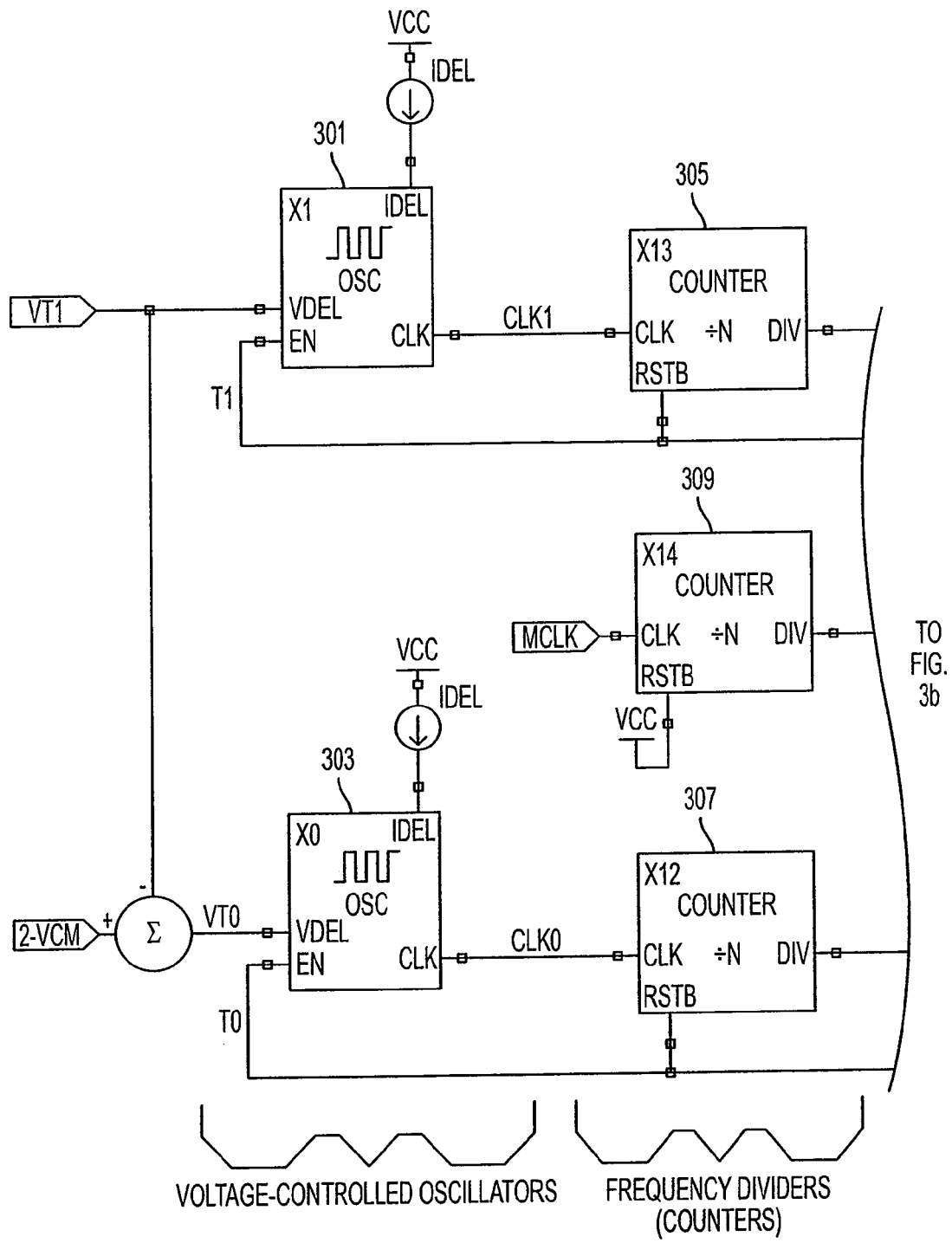
FIG. 3 illustrates a pulse-width modulation circuit that generates an adjustable output signal (OUT) that periodically transitions between two states with an adjustable duty cycle and an adjustable frequency that does not affect the duty cycle.
Figure 3B:
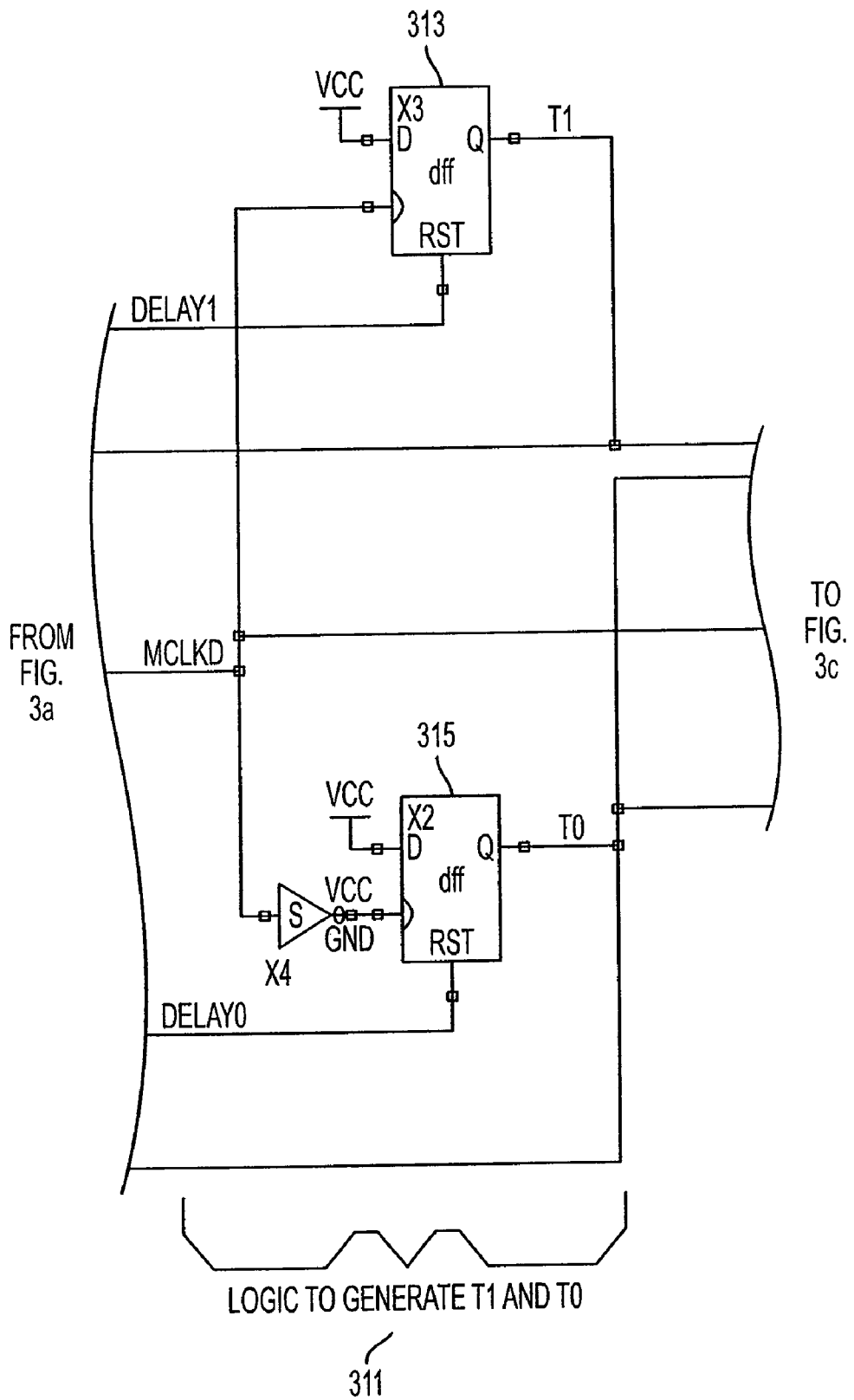
Figure 3C:
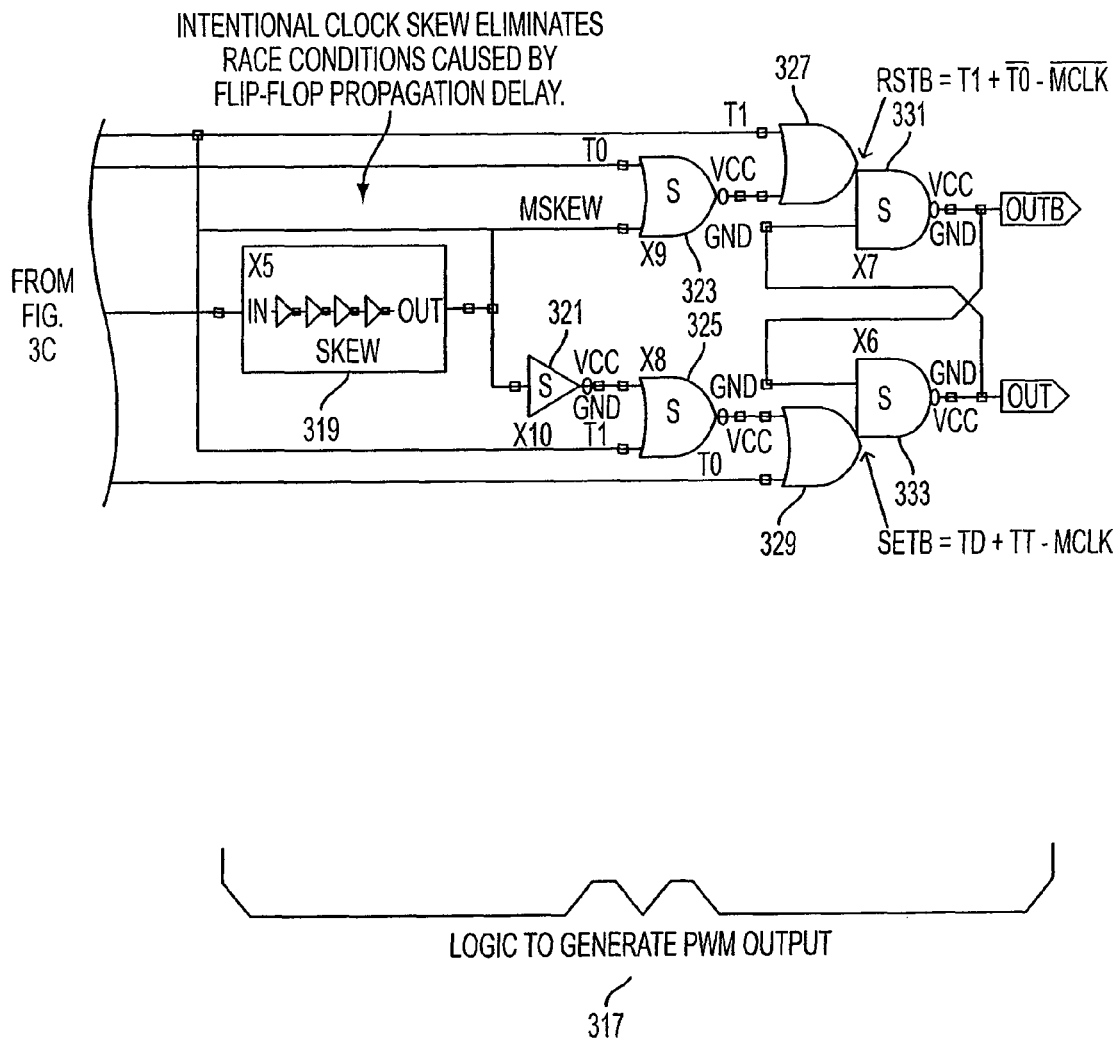

FIG. 3 illustrates a pulse-width modulation circuit that generates an adjustable output signal (OUT) that periodically transitions between two states with an adjustable duty cycle and an adjustable frequency that does not affect the duty cycle.

Each of the adjustable delay circuits 201 and 203 may replaced by an adjustable clock circuit 301 and 303, respectively, and by a programmable frequency divider circuit (counter) 305 and 307 to reduce the frequency to adjustably low values.

The adjustable clock circuits 301 and 303 may function just like the adjustable delay circuits 201 and 203 illustrated in FIG. 2, except that they may instead produce an adjustable clock signal. Each clock may be initiated by a signal at an EN input and have a frequency proportional to a signal at an VDEL input as a fine tuning control and to a signal at an IDEL input as a course tuning control. An additional programmable frequency divider circuit 309 may divide the frequency of the periodic reference signal in the circuit illustrated in FIG. 3. The programmable frequency divider circuits 305, 307, and 309 may be configured to divide a signal at an input MCLK by an adjustable frequency scaling signal that may include a programmable integer N deliverable through another input (not shown). The other components and signals may be as described above in connection with FIG. 2. For example, the circuit in FIG. 3 may include a logic section 311 that may include D memories 313 and 315, and a second logic section 317 that may include delay gates 319, an inverter 321, NOR gates 323 and 325, OR gates 327 and 329, and NAND gates 331 and 333 configured to cause OUT to transition based on T1, T0, and MCLKD, as illustrated in FIG. 1 in connection with MCLK. The resulting waveforms may look the same as what are shown in FIG. 1, except that MCLKD may determine the frequency of OUT, rather than MCLK.

Figure 4:
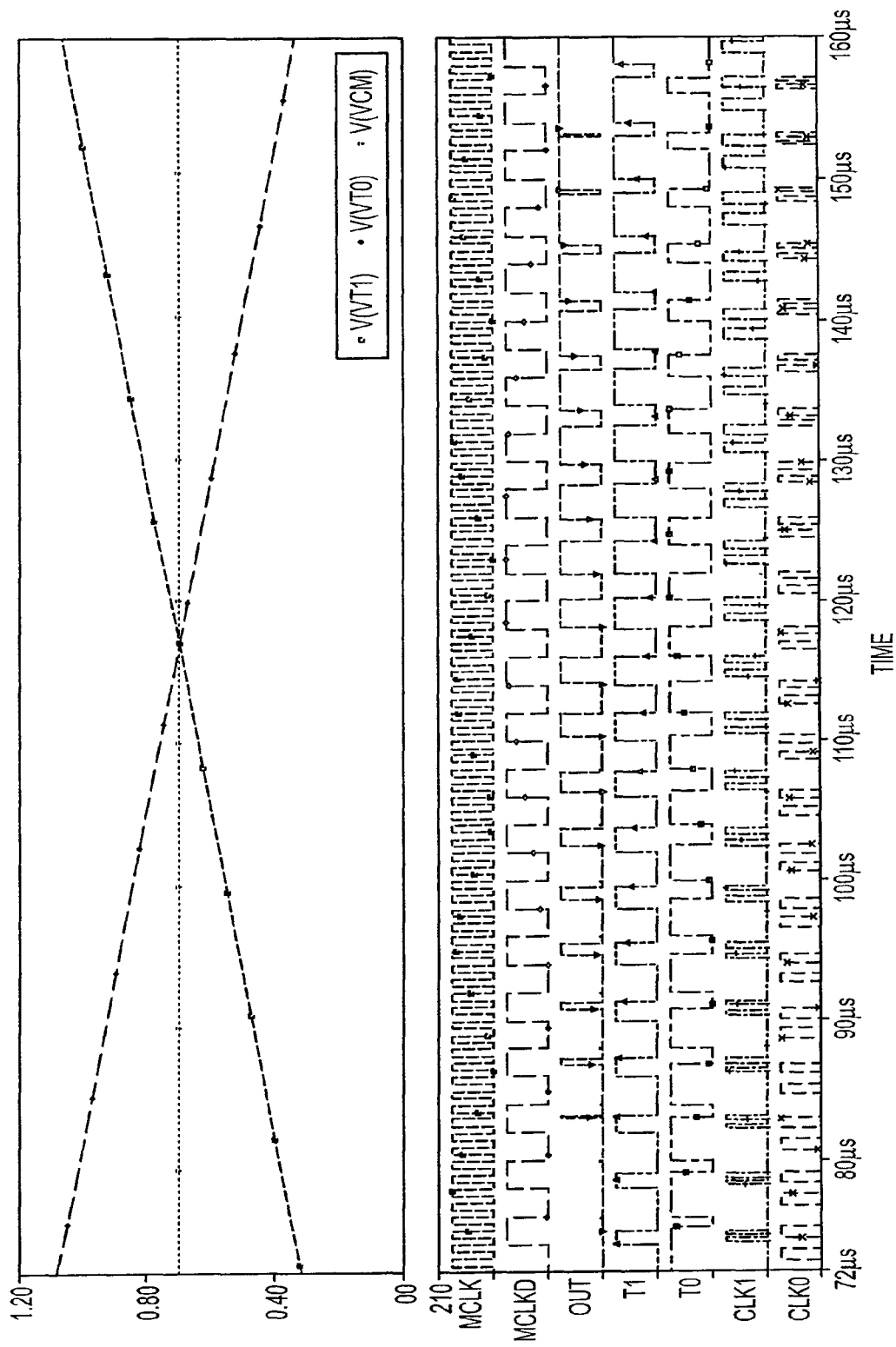
FIG. 4 illustrates various signals in the circuit illustrated in FIG. 3.

FIG. 4 illustrates various signals in the circuit illustrated in FIG. 3. N may be arbitrarily set to 4, but may instead be any other integer. As illustrated in FIG. 4, the adjustable clock circuits 301 and 303 may run at varying frequencies, driving÷4 programmable frequency divider circuits 305 and 307, to generate the pulse-width modulated output OUT at ¼ the frequency of the periodic reference signal MCLK. The frequency of OUT may thus be adjusted by making different selections for N, all without varying the duty cycle OUT, given the same $V_{T1}$.

Figure 13:
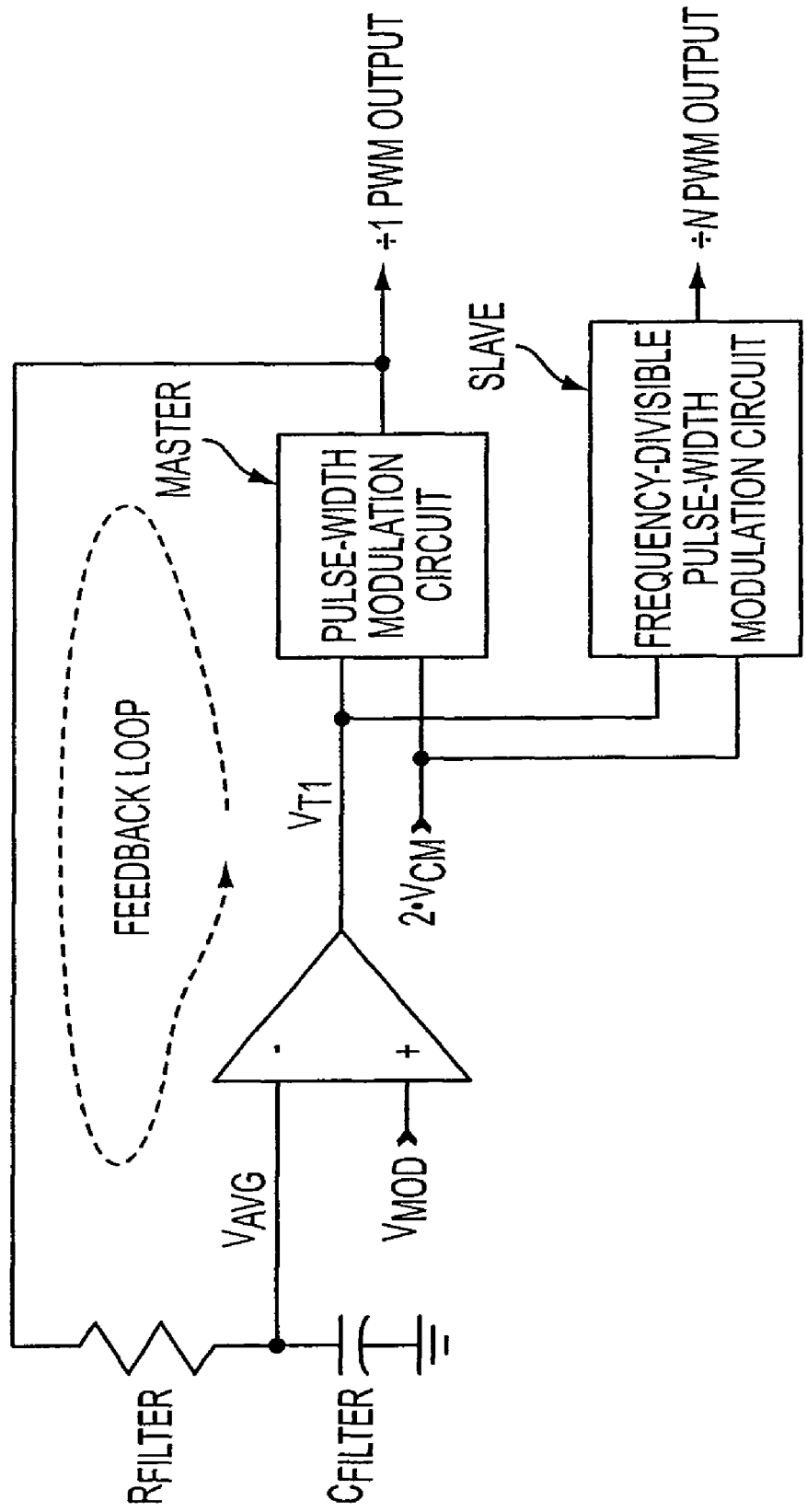
FIG. 13 illustrates a replica-biasing scheme which may be used to servo the duty cycle to a precise value in connection with a pulse-width modulation circuit that has an adjustable frequency.

FIG. 13 illustrates a replica-biasing scheme which may be used to servo the duty cycle to a precise value in connection with a pulse-width modulation circuit that has an adjustable frequency. As illustrated in FIG. 13, a replica-biasing scheme may be added to the circuits which have been illustrated. In one implementation, the pulse-width modulation circuit illustrated in FIG. 2 may be placed in a feedback loop to servo the duty cycle of the pulse-width modulation circuit illustrated in FIG. 3 to a precision value. Assuming voltage-controlled adjustable delay circuits, the two control voltages, $V_{T1}$ and $V_{CM}$, may be used as bias voltages for the circuit illustrated in FIG. 3. The circuit illustrated in FIG. 2 may function as a replica master, producing the bias conditions for the circuit illustrated in FIG. 3, which may operate as the slave. The circuit illustrated in FIG. 3 may inherit the accurate duty cycle of the master, but may produce arbitrarily low frequencies.

The circuit illustrated in FIG. 2 could instead be configured to operate as the slave, biased by the circuit illustrated in FIG. 3 as the replica master. This may be useful when it is easier to control the duty cycle accuracy of a lower-frequency PWM signal. Then, the higher-frequency circuit FIG. 2 may inherit the same duty cycle.

Although having been discussed in connection with the PWM circuits illustrated in FIGS. 2 and 3, the replica biasing circuit illustrated in FIG. 13 may instead be used in connection with any other type of PWM circuits, so long as the master and slave both produce the same duty cycle for a given set of control voltages. The slave PWM circuit may or may not have an adjustable frequency. The frequency of the master PWM circuit may be higher or lower than the frequency of the slave PWM circuit.

Another implementation may use frequency divisible-circuits, such as the circuit illustrated in FIG. 3, as both master and slave. This may be capable of producing an output that is higher or lower in frequency than the periodic reference signal.

The circuit illustrated in FIG. 2 may allow $t_1$ and $t_0$ to run concurrently (i.e., T1 and T0 may be active at the same time). To accomplish this, two separate adjustable delay circuits may be needed. Likewise, the frequency-divisible circuit illustrated in FIG. 3 may require two adjustable clock circuits and two programmable frequency divider circuits, plus an additional programmable frequency divider circuit for the periodic reference signal.

An alternate circuit may allow for resource sharing. In the circuit of the type illustrated in FIG. 2, only a single adjustable delay circuit may be necessary. The adjustable delay element may be shared, or multiplexed, to generate both T1 and T0. In a frequency-divisible circuit such as the circuit illustrated in FIG. 3, only one adjustable clock circuit and one programmable frequency divider circuit (plus the additional programmable frequency divider circuit for the periodic reference signal) may be necessary. To facilitate this, $t_1$ and $t_0$ may not run concurrently, i.e., meaning that T1 and T0 may never be active at the same time.

Figure 5B:
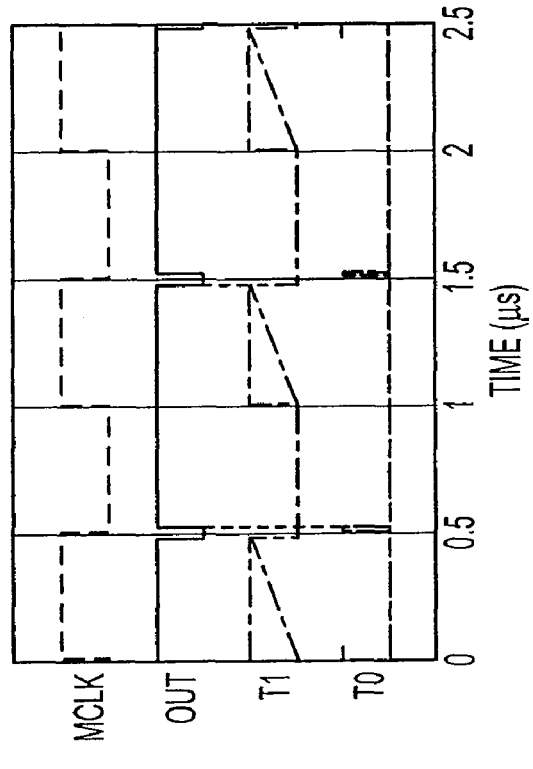
FIG. 5($a$) illustrates an adjustable output signal (OUT) that periodically transitions between two states with a 95% duty cycle, a first pulse signal (T0), a second pulse signal (T1), and a periodic reference signal (MCLK), wherein α (defined below) is 1.0.
Figure 5A:
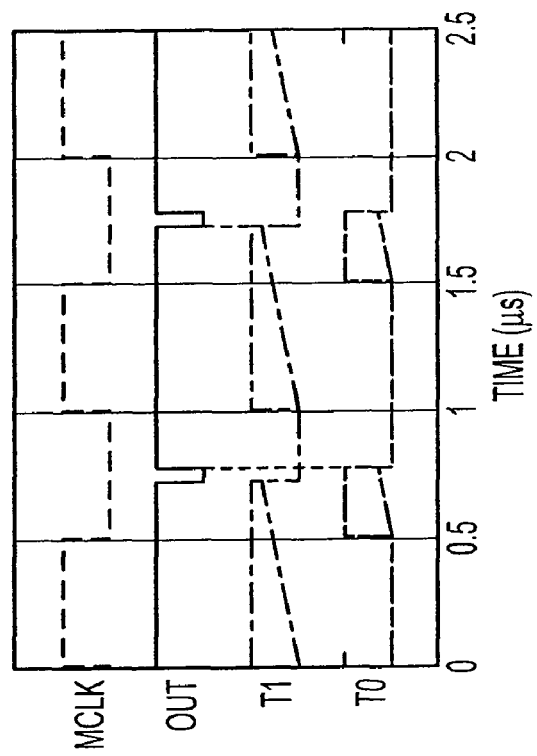

FIG. 5(a) illustrates an adjustable output signal (OUT) that periodically transitions between two states with a 95% duty cycle, a first pulse signal (T0), a second pulse signal (T1), and a periodic reference signal (MCLK), wherein α is 1.0.

As shown in FIG. 5(a), at high duty cycles T0 is nearly completely overlapped by T1. FIG. 5(b) shows that a setting of α=0.5 may almost work. However, that setting may:

Require $t_0$=0 seconds (which may not be allowed)

Allow exactly 0 seconds between T1 falling and T0 rising at 100% duty cycle (and the dual problem at 0%).

A different solution may be used to prevent the $t_1$ and $t_0$ time delays from ever having to operate at the same time. The overlap may be eliminated with two changes.

First, start T1 and T0 later. As long as they start early enough to control the falling and rising OUT edges, this may provide more time for the other delay to complete.

Second, transition from dual-edge PWM to single-edge PWM near 0% and 100%. That way, only one of the delays may be needed in those conditions where one delay is very long.

FIG. 6 illustrates an adjustable output signal (OUT) that periodically transitions between two states with a varying duty cycle, a first pulse signal (T0), a second pulse signal (T1) that does not overlap with the first pulse signal (T0), a double frequency periodic reference signal (M2X), and two periodic quadrature reference signals (MCLKQ, and MCLKI), wherein α is 1.25.

As illustrated in FIG. 6, implementing these changes may require more detailed timing than in the circuit illustrated in FIG. 2. A four-phase periodic reference signal may provide additional clock edges to provide additional timing resolution. A convenient way to generate a four-phase periodic reference signal may be to provide a double-frequency clock, M2X, and divide its frequency by two. By using both rising and falling edges of M2X, two÷2 clocks may be available that are 90° out of phase (in quadrature). They may be called MCLKI and MCLKQ.

When the system is operating in single-edge PWM mode, one edge may be controlled by either T1 or T0 and the other edge may be controlled by the periodic reference signal. When only one of $t_1$ or $t_0$ is needed, the system may disable the other. A system that meets these requirements may be designed around the following set of rules:

The OUT falling edge may never move left of the MCLKI falling edge, but may be pushed right by T1 to increase duty-cycle. The OUT rising edge may never move left of the MCLKI rising edge, but may be pushed right by T0 to decrease duty-cycle.

To avoid a dead zone at a 50% duty-cycle, both T1 and T0 may be controlling their respective edges. This may require those delays to be longer than the periodic reference signal's ¼-period (or α>1, as shown later).

For duty cycle>75%, bypass T0 (this may require single-edge PWM control by T1 only).

For duty cycle<25%, bypass T1 (this may require single-edge PWM control by T0 only).

As shown in the table below, the circuit may pass through five distinct regions of operation as the duty cycle sweeps from 0% to 100.

| Region | Region of Operation | Modulation Type | T1 activates | T0 activates | T1 affects OUT | T0 affects OUT | Duty Cycle |
|---|---|---|---|---|---|---|---|
| 1 | Duty Cycle < 25% | single-edge | | ✓ | | ✓ | $\frac{3}{4} - \frac{t_0}{T_M}$ |
| 2 | 25% ≦ Duty Cycle < 1 − $\frac{\alpha}{2}$ | single-edge | ✓ | ✓ | | ✓ | $\frac{3}{4} - \frac{t_0}{T_M}$ |
| 3 | 1 − $\frac{\alpha}{2}$ ≦ Duty Cycle ≦ $\frac{\alpha}{2}$ | dual-edge | ✓ | ✓ | ✓ | ✓ | $\frac{1}{2} + \frac{t_1 - t_0}{T_M}$ |
| 4 | $\frac{\alpha}{2}$ < Duty Cycle ≦ 75% | single-edge | ✓ | ✓ | ✓ | | $\frac{1}{4} + \frac{t_1}{T_M}$ |
| 5 | 75% < Duty Cycle | single-edge | ✓ | | ✓ | | $\frac{1}{4} + \frac{t_1}{T_M}$ |

Choosing α=1.25 may result in transitions at 25%, 37.5%, 62.5%, and 75%. The transitions between regions of operation may then be continuous. The "<" and "≦" operators may be interchangeable.

The various regions illustrated in this table may be described as follows:

1. Duty Cycle<25%—The four-phase clock may provide a clock edge that is aligned with OUT's rising edge at 25% duty cycle, making it possible to detect this condition. If duty cycle<25% (or equivalently, $t_0>\frac{1}{2} \cdot T_M$), this may indicate that T1 is not necessary and may be bypassed to allow for the long T0.
2. 25%≦Duty Cycle<37.5%—Within this region, T1 may not be necessary (because OUT's falling edge may never move left of MCLKI's falling edge), but this may be difficult to detect. So T1 may activate, but may have no effect.
3. 37.5%≦Duty Cycle≦62.5%—Within this region, both T1 and T0 may be active and controlling their respective edges. The transition at 37.5% (62.5%) may occur seamlessly as T1 (T0) extends long enough to push OUT's falling (rising) edge past MCLKI's falling (rising) edge.
4. 62.5%<Duty Cycle≦75%—Within this region, T0 may not be not necessary (because OUT's rising edge may never move left of MCLKI's rising edge), but this may be difficult to detect. So T0 may activate, but may have no effect.
5. 75%<Duty Cycle—The four-phase clock may provide a clock edge that is aligned with OUT's falling edge at 75% duty cycle, making it possible to detect this condition. If duty cycle>75% (or equivalently, $t_1>\frac{1}{2} \cdot T_M$), this may indicate T0 is not necessary and may be bypassed to allow for the long T1.

Figure 7A:
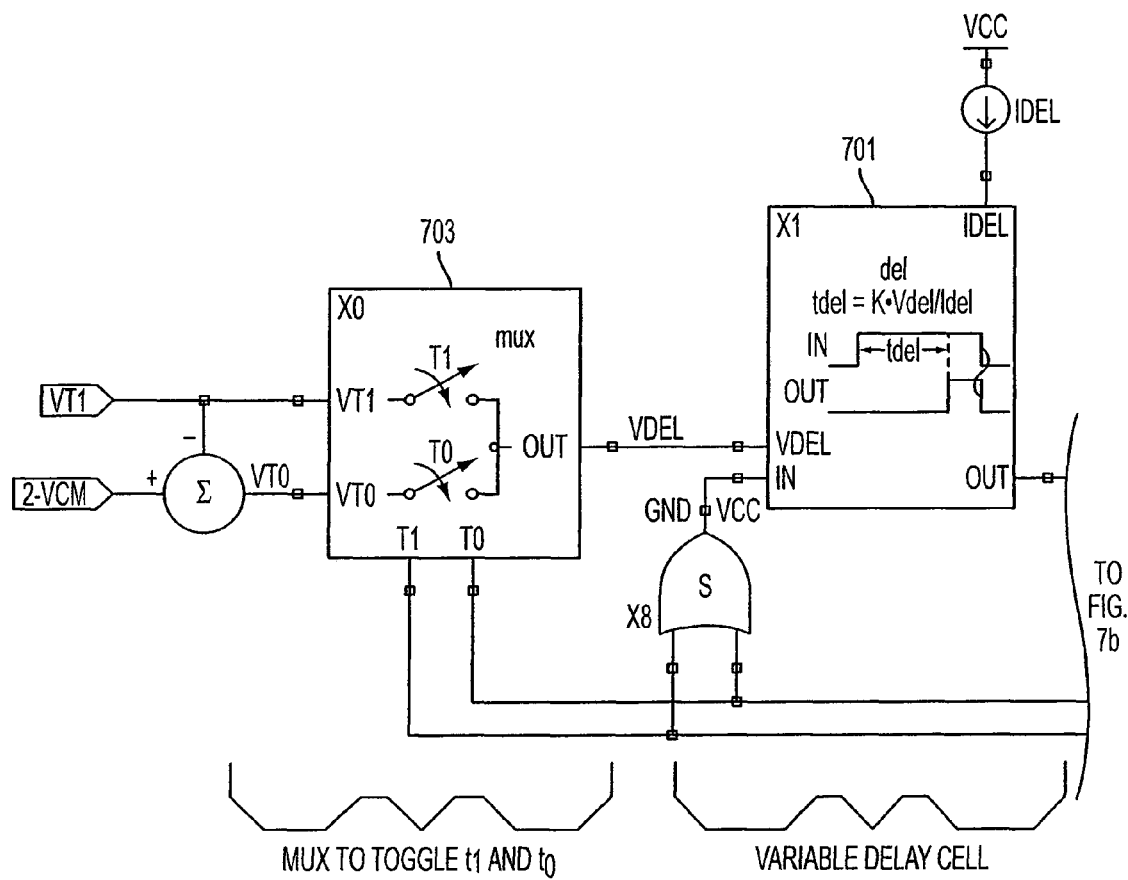
FIG. 7 illustrates a pulse-width modulation circuit that generates an adjustable output signal (OUT) that periodically transitions between two states with an adjustable duty cycle and that multiplexes a single adjustable delay circuit.
Figure 7B:
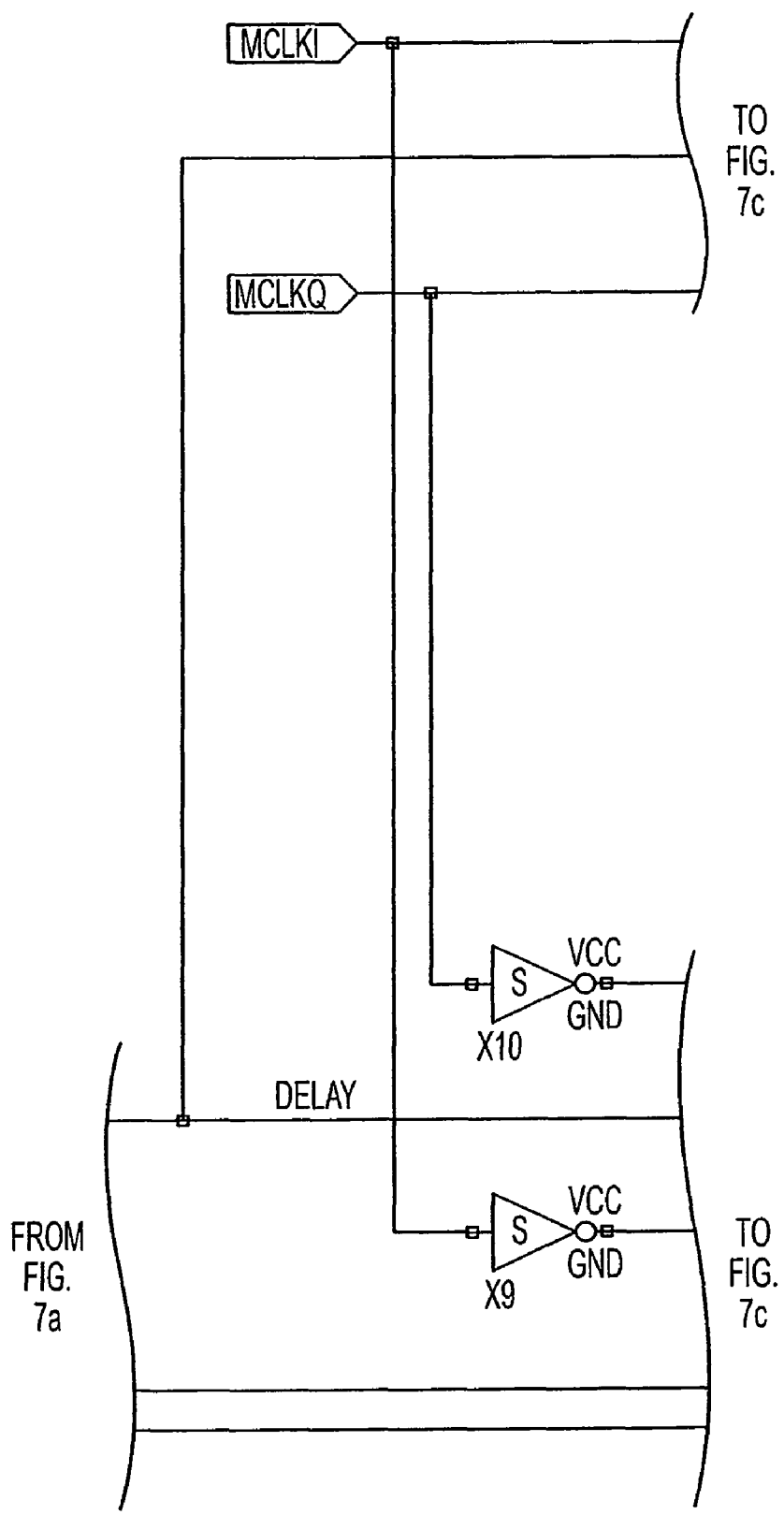
Figure 7C:
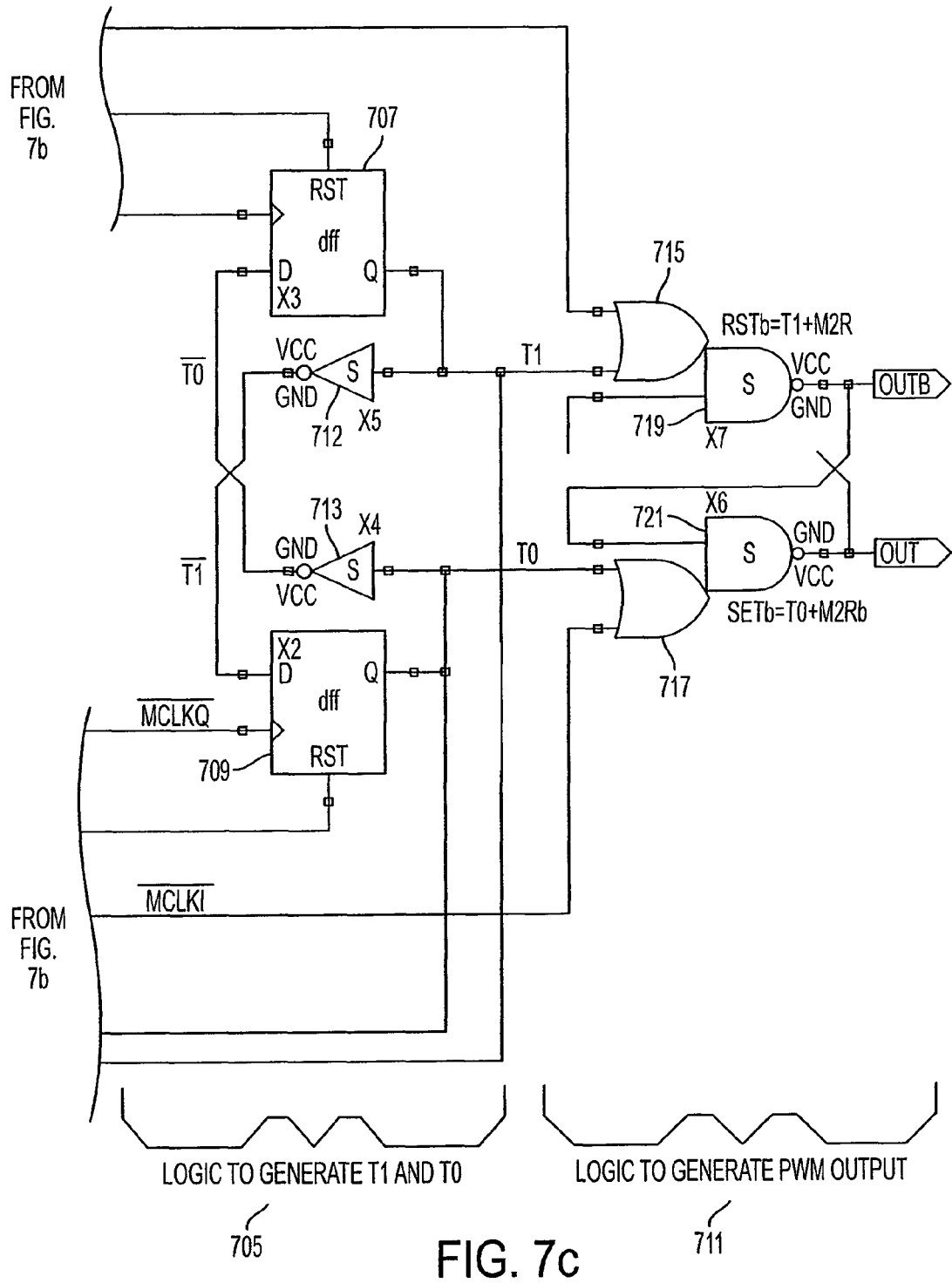
Figure 8:
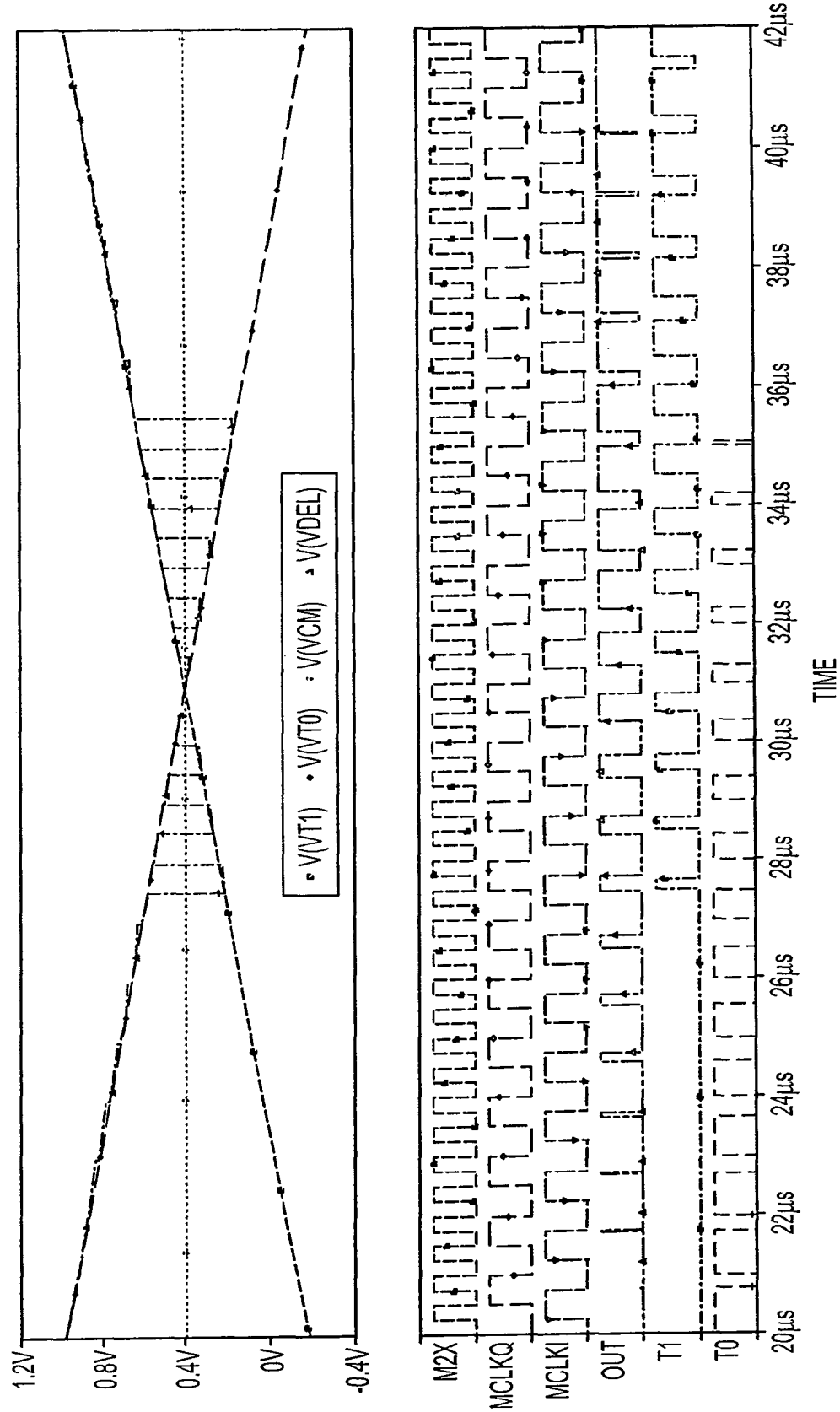
FIG. 8 illustrates various signals in the circuit illustrated in FIG. 7.

FIG. 7 illustrates a pulse-width modulation circuit that generates an adjustable output signal (OUT) that periodically transitions between two states with an adjustable duty cycle and that mutiplexes a single adjustable delay circuit. FIG. 8 illustrates various signals in the circuit illustrated in FIG. 7.

As illustrated in FIGS. 7 and 8, only one adjustable delay circuit 701 may be used. It may be of the same type as the adjustable delay circuit 201 illustrated in FIG. 2. A multiplexer circuit 703 may be configured to allow the control voltages $V_{T1}$ and $V_{T0}$ to share the adjustable delay circuit 701.

An output OUT from the multiplexer circuit may toggle between $V_{T1}$ and $V_{T0}$ based on which of T1 or T0 is active.

The logic section 705 that generates T1 and T0 may be clocked by the 90° phase-shifted MCLKQ, so that T1 and T0 may be activated a quarter-cycle later. Those signals may be crossed as inputs to cross-linked D memories 707 and 709 and thus may bypass T1 if $t_0>\frac{1}{2} \cdot T_M$ and bypass T0 if $t_1>\frac{1}{2} \cdot T_M$.

The second logic section 711 may also be slightly different than the second logic section 213 illustrated in FIG. 2. It may include inverters 712 and 713, OR gates 715 and 717, and NAND gates 719 and 721. The second logic section 711 may be configured to arbitrate between MCLKI, T1, and T0, thus controlling the OUT edges as follows:

On a rising MCLKI edge:
 Set OUT high if T0=0, otherwise wait until T0 falls.
 If T1 is still high, MCLKI may prevent its falling edge from resetting OUT to allow for 100% duty cycle.
On a falling MCLKI edge:
 Reset OUT low if T1=0, otherwise wait until T1 falls.
 If T0 is still high, $\overline{MCLKI}$ may prevent its falling edge from setting OUT to allow for 0% duty cycle.

This technique may allow for short positive/negative pulse widths in OUT that are not limited by propagation delays. It may also allow for frequency division while maintaining duty cycle. In addition, it may be more amenable to being constructed on an integrated circuit. For example, it may allow for resource-sharing, reducing the number of adjustable delay circuits, oscillators, and frequency dividers. The result may be a very compact solution.

In a frequency-divisible version, this design approach may do away with having two oscillators running simultaneously, eliminating potential performance problems.

Since $t_1$ and $t_0$ do not always execute in the resource-sharing implementation illustrated in FIG. 7, $t_1$ may not be treated as the input to the system. Instead, $V_{T1}$ may be treated as the input. $V_{T1}$ may control the adjustable delay circuit to generate $t_1$. But since $V_{T0}$ is assumed to be dependent on $V_{T1}$, it may also control $t_0$. Therefore, $V_{T1}$ may always govern the duty cycle.

The MCLKI and MCLKQ periods may be defined by →$T_M = 4 \cdot V_{MCTRL} \cdot K_M$ The variable delays may be defined by →$t_0 = V_{T0} \cdot K_{PW}$
$t_1 = V_{T1} \cdot K_{PW}$ $K_M$ and $K_{PW}$ may represent the gain of the adjustable delay circuits for the master oscillator and PWM circuit, respectively. They may have units of μs/V. $V_{MCTRL}$ may be the input control voltage for the master oscillator (analogous to $V_{T1}$ and $V_{T0}$). The periodic reference signal may require four delays to allow for quadrature generation.

At 50% duty-cycle, $t_0=t_1$ and therefore $V_{T0}=V_{T1}=V_{CM}$. If the assumption of a linear system is continued, $V_{T0}$ may be calculated as follows:

$$V_{T0} = 2 \cdot V_{CM} - V_{T1}$$

The time delays may be related to the periodic reference signal period as follows:

$$t_0 = V_{T0} \cdot K_{PW}$$

$$t_0 = (2 \cdot V_{CM} - V_{T1}) \cdot K_{PW}$$

$$t_0 = 2 \cdot V_{CM} \cdot K_{PW} - t_1$$

$$t_1 + t_0 = \frac{V_{CM}}{V_{MCTRL}} \cdot \frac{K_{PW}}{K_M} \cdot (2 \cdot V_{MCTRL} \cdot K_M)$$

$$t_1 + t_0 = \frac{V_{CM}}{V_{MCTRL}} \cdot \frac{K_{PW}}{K_M} \cdot \frac{T_M}{2}$$

$$t_1 + t_0 = \alpha \cdot \frac{T_M}{2}, \text{ where } \alpha = \frac{V_{CM}}{V_{MCTRL}} \cdot \frac{K_{PW}}{K_M}$$

At 50% duty cycle, $$t_0 = t_1 = \alpha \cdot \frac{T_M}{4},$$

which may be half as long as for the circuit in FIG. 2 because T1 and T0 may now be activated later (phase-shifted) by the quadrature clock MCLKQ. The last equation above that is set off from the text may only be valid when both T1 and T0 are active.

The equation for duty cycle may change depending on the region of operation.

Low Duty Cycle

Duty Cycle < ~37.5%

Regions 1 and 2 may use single-edge pulse-width modulation with $t_0$ alone dictating the duty cycle.

$$\text{Dutycycle} \equiv 1 - \frac{t_{OFF}}{T_M},$$

where $t_{OFF}$ is the negative pulse width $$\text{Dutycycle} = 1 - \frac{\frac{T_M}{4} + t_0}{T_M},$$

$t_0$ begins ¼-period after $t_{OFF}$ begins on MCLKI's falling edge $$\text{Dutycycle} = \frac{3}{4} - \frac{t_0}{T_M}$$

$$\text{Dutycycle} = \frac{3}{4} - \frac{V_{T0} \cdot K_{PW}}{4 \cdot V_{MCTRL} \cdot K_M}$$

$$\text{Dutycycle} = \frac{3}{4} - \frac{(2 \cdot V_{CM} - V_{T1}) \cdot K_{PW}}{4 \cdot V_{MCTRL} \cdot K_M}$$

$$\text{Dutycycle} = \frac{3}{4} - \frac{V_{CM} \cdot K_{PW}}{2 \cdot V_{MCTRL} \cdot K_M} + \frac{V_{T1} \cdot K_{PW}}{4 \cdot V_{MCTRL} \cdot K_M}$$

$$\text{Dutycycle} = \frac{3}{4} - \frac{\alpha}{2} + \frac{\alpha}{4} \cdot \frac{V_{T1}}{V_{CM}}$$

$$\text{Dutycycle} = \frac{3}{4} + \frac{\alpha}{4} \cdot \left( \frac{V_{T1}}{V_{CM}} - 2 \right)$$

Near 50% Duty Cycle

Region 3 may use dual-edge pulse-width modulation. Both T1 and T0 may be active and controlling the OUT edges, assuming $t_1$ and $t_0$ are long enough (more on this below).

$$\text{Dutycycle} \equiv \frac{t_{ON}}{T_M},$$

where $t_{ON}$ is the positive pulse width $$\text{Dutycycle} = \frac{\frac{T_M}{2} + t_1 - t_0}{T_M}, \frac{T_M}{2}$$

is the delay between the T1 and T0 rising edges $$\text{Dutycycle} = \frac{1}{2} + \frac{t_1 - t_0}{T_M}$$

$$\text{Dutycycle} = \frac{1}{2} + \frac{t_1 - \left( \alpha \cdot \frac{T_M}{2} - t_1 \right)}{T_M}$$

$$\text{Dutycycle} = \frac{1}{2} - \frac{\alpha}{2} + 2 \cdot \frac{t_1}{T_M}$$

$$\text{Dutycycle} = \frac{1}{2} - \frac{\alpha}{2} + 2 \cdot \frac{V_{T1} \cdot K_{PW}}{4 \cdot V_{MCTRL} \cdot K_M}$$

$$\text{Dutycycle} = \frac{1}{2} - \frac{\alpha}{2} + \frac{\alpha}{2} \cdot \frac{V_{T1}}{V_{CM}}$$

$$\text{Dutycycle} = \frac{1}{2} + \frac{\alpha}{2} \cdot \left( \frac{V_{T1}}{V_{CM}} - 1 \right)$$

High Duty Cycle

Duty Cycle > ~62.5%

The last two regions may be single-edge pulse-width modulation again, controlled by T1.

$$\text{Dutycycle} \equiv \frac{t_{ON}}{T_M},$$

where $t_{ON}$ is the positive pulse width $$\text{Dutycycle} = \frac{\frac{T_M}{4} + t_1}{T_M},$$

$t_1$ begins ¼-period after $t_{ON}$ begins on MCLKI's rising edge $$\text{Dutycycle} = \frac{1}{4} + \frac{t_1}{T_M}$$

$$\text{Dutycycle} = \frac{1}{4} + \frac{V_{T1} \cdot K_{PW}}{4 \cdot V_{MCTRL} \cdot K_M}$$

$$\text{Dutycycle} = \frac{1}{4} + \frac{\alpha}{4} \cdot \frac{V_{T1}}{V_{CM}}$$

Near 50% duty cycle (region 3), the gain from VT1 may be twice as much as in regions 1, 2, 4, or 5. That may be a result of dual-edge modulation. Since both edges are moving, the duty cycle may change twice as fast for a change in the input.

Transitions Between Regions of Operation

Regions 1&2: When does T0's falling edge coincide with MCLKQ's rising edge:

$$\text{Dutycycle}_{1-2} \text{ occurs } @ t_0 = 1/2 \cdot T_M$$

$$\text{Dutycycle}_{1-2} = \frac{3}{4} - \frac{t_0}{T_M} = \frac{3}{4} - \frac{1}{2} = \frac{1}{4}$$

Regions 2&3: When does T1's falling edge coincide with MCLKI's falling edge:

$$\text{Dutycycle}_{2-3} \text{ occurs } @ t_1 = 1/4 \cdot T_M$$

$$\text{Dutycycle}_{2-3} = \frac{1}{2} - \frac{\alpha}{2} + 2 \cdot \frac{t_1}{T_M} = 1 - \frac{\alpha}{2}$$

Regions 3&4: When does T0's falling edge coincide with MCLKI's rising edge:

$$\text{Dutycycle}_{3-4} \text{ occurs } @ t_0 = 1/4 \cdot T_M$$

$$\text{Dutycycle}_{3-4} = \frac{1}{2} + \frac{t_1 - t_0}{T_M}$$
$$= \frac{1}{2} + \frac{\left(\alpha \cdot \frac{T_M}{2} - t_0\right) - t_0}{T_M}$$
$$= \frac{1}{2} + \frac{\alpha}{2} - \frac{2 \cdot t_0}{T_M}$$
$$= \frac{\alpha}{2}$$

Regions 4&5: When does T1's falling edge coincide with MCLKQ's falling edge:

$$\text{Dutycycle}_{4-5} \text{ occurs } @ t_1 = 1/2 \cdot T_M$$

$$\text{Dutycycle}_{4-5} = \frac{1}{4} + \frac{t_1}{T_M} = \frac{1}{4} + \frac{1}{2} = \frac{3}{4}$$

As shown in the table below, the first and last transitions may be fixed by the use of the quadrature clock to start T1 and T0. But the other transitions may depend on α. The exact duty cycle where these region transitions occur may not be important (because the transition is continuous). However, if α is 1.0 or 1.5, the boundaries may collide and may eliminate some of the regions. To attain the desired operation, these transitions may be spaced apart, so α=1.25 may be a good value to use.

TABLE

Transitions Between Regions of Operation

| Transition between... | | α = 1.0 | α = 1.25 | α = 1.5 |
|---|---|---|---|---|
| Region 1 & 2 | dutycycle$_{1-2}$ | 25% | 25% | 25% |
| Region 2 & 3 | dutycycle$_{2-3}$ | 50% | 37.5% | 25% |
| Region 3 & 4 | dutycycle$_{3-4}$ | 50% | 62.5% | 75% |
| Region 4 & 5 | dutycycle$_{4-5}$ | 75% | 75% | 75% |

Limits on α

The following may demonstrate the feasibility of the design.

Eliminate Dead Zone

At 50% duty cycle, $t_1 = t_0$. If the delays are longer than a quarter of the periodic reference signal period, they may control the rising and falling OUT edges. But if they are shorter than that, OUT may be controlled only by MCLKI and the input $V_{T1}$ may have no control of the duty cycle. This may create a "dead zone" region which may be undesirable (although it's conceivable that some applications may find this useful).

FIGS. 9(a), 9(b), and 9(c) and FIGS. 10(a), 10(b), and 10(c) show this in the waveforms and in the transfer function from $V_{T1}$ to duty cycle. FIGS. 9(a), 9(b), and 9(c) illustrate various signals in FIG. 7 with an α of 0.75, 1.00, and 1.25, respectively. FIGS. 10(a), 10(b), and 10(c) illustrate the duty cycle of the adjustable output signal OUT in FIG. 7 at various adjustable pulse width control signal $V_{T1}$ values and with an α of 0.75, 1.00, and 1.25, respectively.

50% Duty Cycle and $t_1 = t_0$ with Three Different Values for α

For α=0.75 there may be a control dead zone where changes in $V_{T1}$ have no affect on the duty cycle. Furthermore, there may be no dual-edge PWM region (see the last table above).

When α reaches 1.0, the dead zone may disappear. At 50% duty cycle, the falling edges of T1 and T0 may coincide exactly with the falling and rising edges of MCLKI, respectively. However, region 3 may exist only at exactly 50%, as reflected in the last table above. Since it may be difficult to control α perfectly, this might not be a desirable situation.

When α=1.25, the dead zone may be eliminated, and there may be a region of double gain because both rising and falling OUT edges may be modulated (dual-edge PWM).

Therefore, eliminating the dead zone may require α≦1, which may force $t_1=t_0$ to be greater than or equal to $\frac{1}{4} \cdot T_M$ at 50% duty cycle.

Detecting when T1 or T0 Isn't Needed

In order to allow T1 to be bypassed for small duty cycles, the criteria $t_0 > \frac{1}{2} \cdot T_M$ may be used as an indication that $t_1$ is not needed (and vice-versa). For that to be valid may require $t_1 < \frac{1}{4} \cdot T_M$ so that MCLKI's falling edge has taken control from T1's falling edge.

$$t_1 < \frac{T_M}{4}$$

$$\alpha \cdot \frac{T_M}{2} - t_0 < \frac{T_M}{4}$$

$$\alpha \cdot \frac{T_M}{2} - \frac{T_M}{2} < \frac{T_M}{4}$$

$$\alpha < 1.5$$

This requirement may be dependent on when, with respect to the periodic reference signal, T1 and T0 are activated. An eight-phase clock (or other methods of generating more timing flexibility) may allow for larger α.

Require the Minimum Value for $t_1$ and $t_0$ to be Greater Than Zero

The minimum required delay may be kept at greater than zero. Right before they are bypassed:

$$t_{1,min} = t_{0,min} > 0 \text{ seconds}$$

$$\alpha \cdot \frac{T_M}{2} - \frac{T_M}{2} > 0 \text{ seconds}$$

$$\alpha > 1$$

In summary, the requirement for a practical implementation that eliminates a control dead zone, allows for bypassing T1 or T0 when they aren't needed, and doesn't require negative delays may be:

$$1 < \alpha < 1.5$$

EXAMPLE

In the calculations below, α=1.25 and the PWM output frequency OUT may be at 1 MHz. This may mean that $T_M$=1 μs. $K_M$=0.5 μs/V, which may mean $V_{MCTRL}$=0.5V (so that the 2× master oscillator runs at 2 MHz). Finally, $V_{CM}$=0.5V.

$$t_{0,max} = t_{1,max} = \frac{3}{4} \cdot T_M = 0.75 \text{ μs (to reach 0\% or 100\% duty cycle)}$$

$$t_{0,min} = t_{1,min} = \frac{T_M}{2} \cdot (\alpha - 1) = 0.125 \text{ μs}$$

(can occur at 25% or 75%, before delay is bypassed)

Figure 11A:
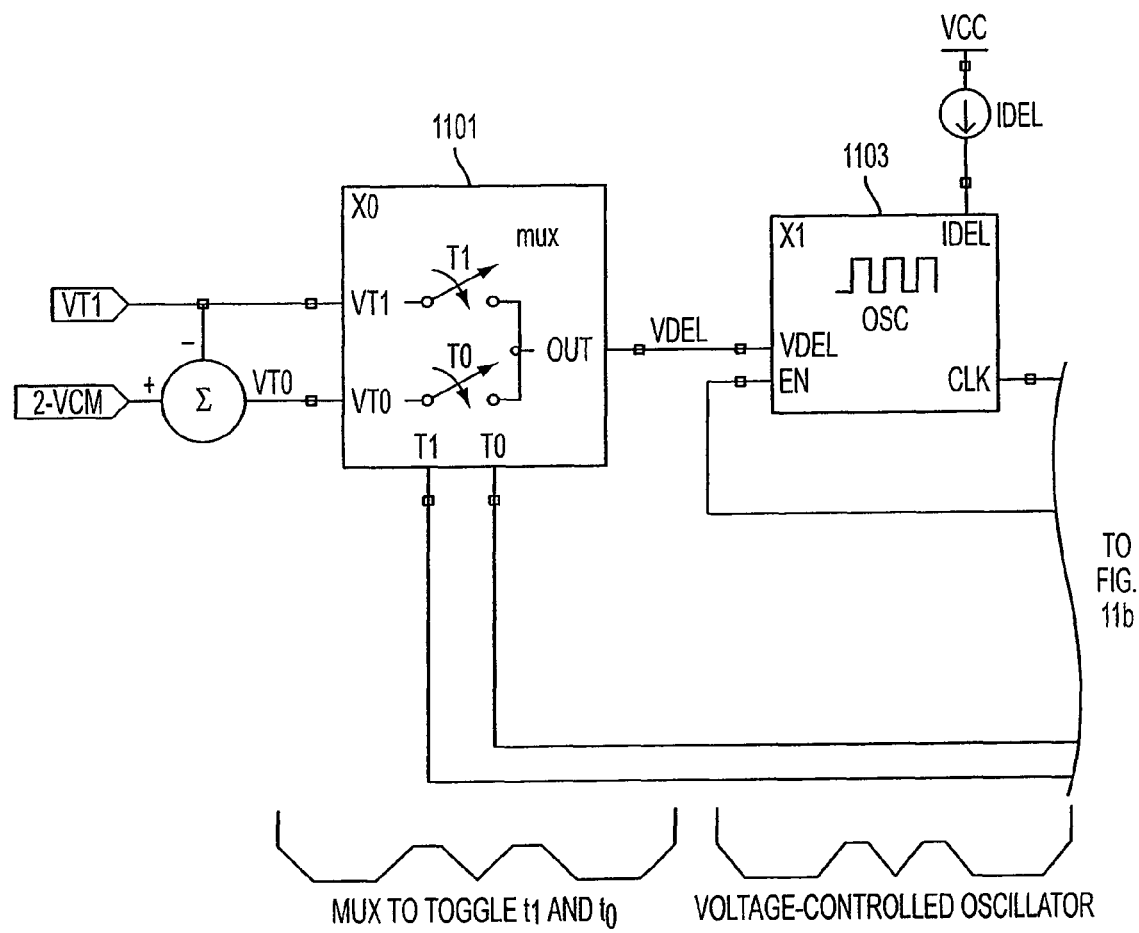
FIG. 11 illustrates a pulse-width modulation circuit that generates an adjustable output signal (OUT) that periodically transitions between two states with an adjustable duty cycle, that has an adjustable frequency that does not affect the duty cycle, and that multiplexes a single adjustable clock circuit.
Figure 11B:
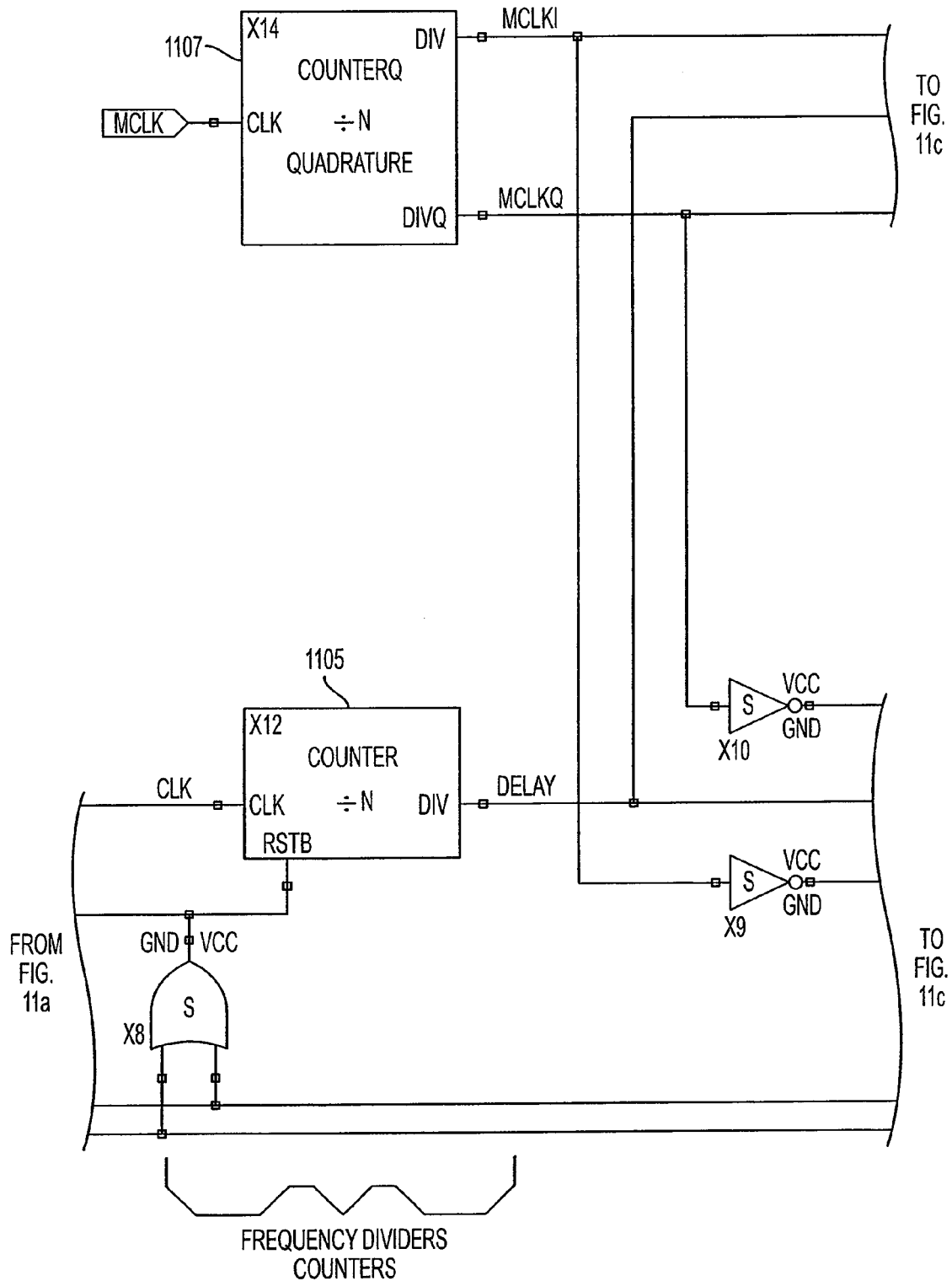
Figure 11C:
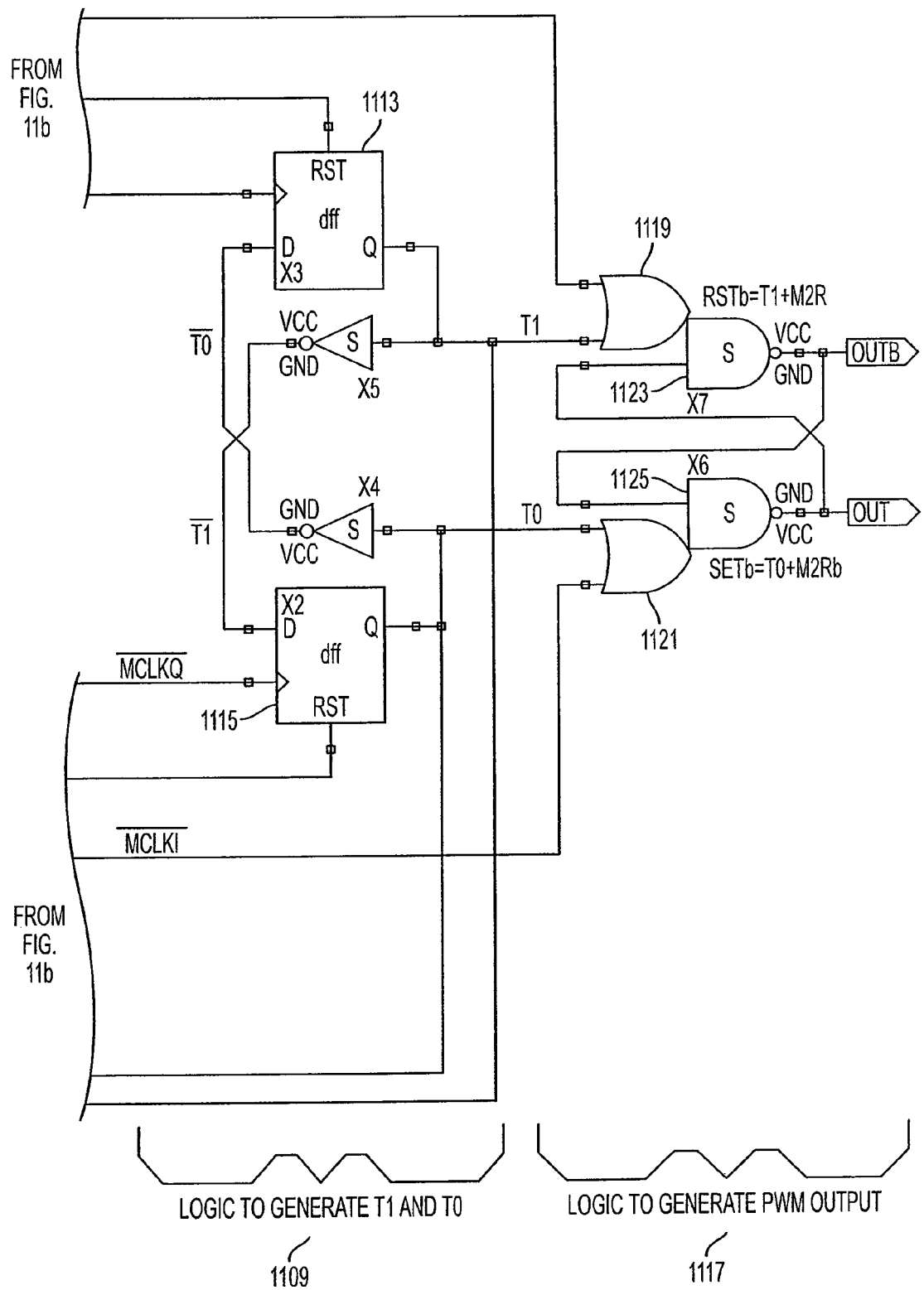
Figure 12:
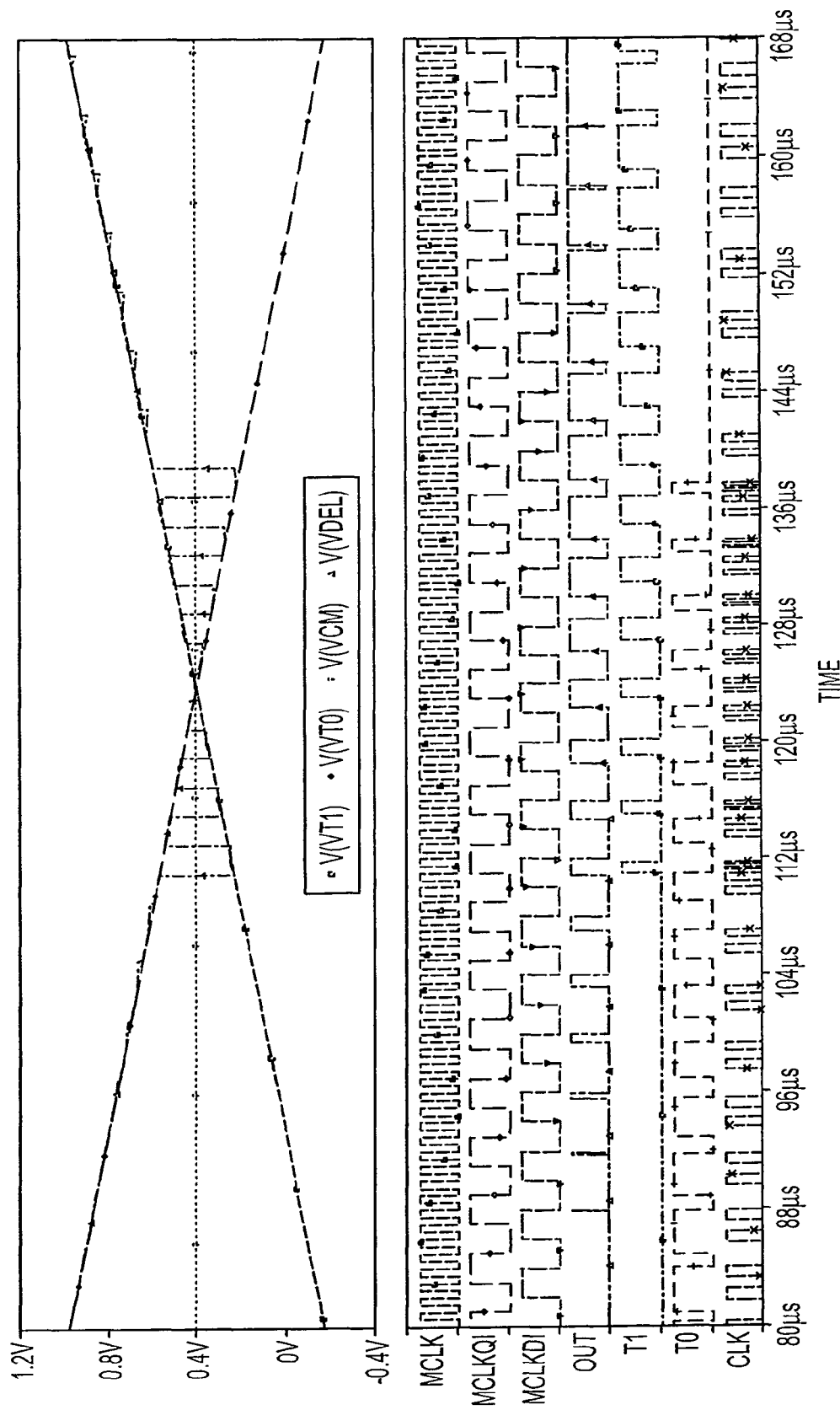
FIG. 12 illustrates various signals in the circuit illustrated in FIG. 11.

FIG. 11 illustrates a pulse-width modulation circuit that generates an adjustable output signal (OUT) that periodically transitions between two states with an adjustable duty cycle, that has an adjustable frequency that does not affect the duty cycle, and that multiplexes a single adjustable clock circuit. FIG. 12 illustrates various signals in the circuit illustrated in FIG. 11.

As illustrated in FIG. 11, a multiplexer circuit 1101 may multiplex $V_{T1}$ and $V_{T0}$ between a single adjustable clock circuit 1103 which requires only a single programmable frequency divider circuit 1105 to generate T1 and T0, along with another programmable frequency divider circuit 1107 to generate MCLKI and MCLKQ. A logic section 1109 may have D memories 1113 and 1115. A second logic section 1117 may have OR gates 1119 and 1121 and NAND gates 1123 and 1125. Both logic sections 1109 and 1117 may be configured to produce the waveforms illustrated in FIG. 12.

The resource-sharing made available by preventing $t_1$ and $t_0$ from running concurrently can be even more effective here. As illustrated in FIG. 11, it may eliminate an adjustable clock circuit and a programmable frequency divider circuit. This may avoid having multiple oscillators running on a single chip.

The components, steps, features, objects, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently.

For example:

- The time delays $t_0$ and $t_1$ may be generated in many different ways, including various types of oscillators (relaxation oscillators, ring oscillators, LC oscillators, etc.) or with single delay circuits such as current-starved inverters or simple RC exponential decays.
- The logic circuits that combine the periodic reference signal and pulse signals to create the PWM output can be implemented in a variety of ways. The logic can be enhanced to prevent 0% or 100% duty cycle, so that the PWM output is always oscillating.
- The periodic reference signal can be an input to the system, and a phase-locked-loop or frequency-to-voltage converter may be utilized to tune the adjustable delay circuits to match.
- In the frequency-adjustable implementations, the frequency variation can be accomplished without a frequency divider logic circuit. One possibility that allows for limited frequency variation is through the IDEL coarse tuning control input.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications which have been cited in this application are hereby incorporated herein by reference.

The phrase "means for" when used in a claim is intended to and should be interpreted to embrace the corresponding structures and materials that have been described and their equivalents. Similarly, the phrase "step for" when used in a claim embraces the corresponding acts that have been described and their equivalents. The absence of these phrases means that the claim is not intended to and should not be interpreted to be limited to any of the corresponding structures, materials, or acts or to their equivalents.

Nothing that has been stated or illustrated is intended or should be interpreted to cause a dedication of any component, step, feature, object, benefit, advantage, or equivalent to the public, regardless of whether it is recited in the claims.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents.

The invention claimed is:

1. A pulse width modulation circuit for generating an adjustable output signal that periodically transitions between a first and a second state with an adjustable duty cycle comprising:
    a first pulse generator circuit configured to generate a first pulse signal that periodically transitions at an adjustable delay with respect to a periodic reference signal;
    a second pulse generator circuit configured to generate a second pulse signal that periodically transitions at an adjustable delay with respect to the periodic reference signal; and
    a logic circuit configured to generate the adjustable output signal based on both the first and the second pulse signals, wherein the logic circuit is configured to cause the adjustable output signal to periodically transition:
        from the first to the second state synchronously with the periodic transitions in the first pulse signal; and
        from the second to the first state synchronously with the periodic transitions in the second pulse signal.

2. The pulse width modulation circuit of claim 1 wherein: the reference signal periodically transitions between a first and a second state; the first pulse generator circuit is configured to cause the first pulse signal to periodically transition at the adjustable delay with respect to the periodic transitions in the reference signal from the first to the second state; and the second pulse generator circuit is configured to cause the second pulse signal to periodically transition at the adjustable delay with respect to the periodic transitions in the reference signal from the second to the first state.

3. A pulse width modulation circuit for generating an adjustable output signal that periodically transitions between a first and a second state with an adjustable duty cycle comprising:
    a first pulse generator circuit configured to generate a first pulse signal that periodically transitions at an adjustable delay with respect to a periodic reference signal;
    a second pulse generator circuit configured to generate a second pulse signal that periodically transitions at an adjustable delay with respect to the periodic reference signal; and
    a logic circuit configured to generate the adjustable output signal based on both the first and the second pulse signals,
    wherein the first and the second pulse generator circuits each include an adjustable delay circuit configured to generate an adjustable delay signal delayed in an adjustable amount which is a function of an adjustable pulse width control signal.

4. The pulse width modulation circuit of claim 3 wherein the adjustable delay circuit included with the first and the second pulse generator circuits is the same circuit.

5. The pulse width modulation circuit of claim 4 further comprising a multiplexer circuit configured to generate the adjustable pulse width control signal by periodically switching between a first adjustable pulse width control signal and a second adjustable pulse width control signal.

6. The pulse width modulation circuit of claim 5 further comprising a generator circuit configured to generate the second adjustable pulse width control signal based on the first adjustable pulse width control signal.

7. The pulse width modulation circuit of claim 6 wherein the generator circuit is configured to cause the second adjustable pulse width control signal to vary in inverse proportion to the first adjustable pulse width control signal.

8. The pulse width modulation circuit of claim 7 wherein the generator circuit includes a subtraction circuit configured to generate the second adjustable pulse width control signal by subtracting the first adjustable pulse width control signal from a constant reference signal.

9. A pulse width modulation, circuit for generating an adjustable output signal that periodically transitions between a first and a second state with an adjustable duty cycle comprising:
    a first pulse generator circuit configured to generate a first pulse signal that periodically transitions at an adjustable delay with respect to a periodic reference signal;
    a second pulse generator circuit configured to generate a second pulse signal that periodically transitions at an adjustable delay with respect to the periodic reference signal; and
    a logic circuit configured to generate the adjustable output signal based on both the first and the second pulse signals,
    wherein the first and the second pulse generator circuits each include an adjustable clock circuit configured to generate an adjustable clock signal having an adjustable frequency which is a function of an adjustable pulse width control signal.

10. The pulse width modulation circuit of claim 9 wherein the adjustable clock circuit included with the first and the second pulse generator circuits is the same circuit.

11. The pulse width modulation circuit of claim 9 wherein the periodic transitions in the adjustable output signal have an adjustable frequency that is a function of an adjustable frequency scaling signal.

12. The pulse width modulation circuit of claim 11 wherein the first and the second pulse generator circuits each include a programmable frequency divider circuit configured to scale the frequency of each adjustable clock signal as a function of the adjustable frequency scaling signal.

13. The pulse width modulation circuit of claim 12 wherein the programmable frequency divider circuit included with the first and the second pulse generator circuits is the same circuit.

14. The pulse width modulation circuit of claim 11 wherein the first and the second pulse generator circuits and the logic circuit are configured so as to cause the duty cycle of the adjustable output signal to remain constant when there is no change in the adjustable pulse width control signal, notwithstanding changes in the adjustable frequency scaling signal.

15. The pulse width modulation circuit of claim 11 wherein the adjustable delay of the first pulse generator circuit plus the adjustable delay of the second pulse generator circuit equals a proportion a of the period of the adjustable frequency of the periodic transitions in the adjustable output signal which does not change, notwithstanding changes in the adjustable frequency scaling signal.

16. The pulse width modulation circuit of claim 15 wherein the proportion a is between 0.5 and 1.5.

17. The pulse width modulation circuit of claim 15 wherein the logic circuit is configured: to base the adjustable output signal on both the first and the second pulse signals when the adjustable duty cycle of the pulse width modulation circuit is within a range; and not to base the adjustable output signal on both the first and the second pulse signals when the adjustable duty cycle of the pulse width modulation circuit is outside of the range.

18. The pulse width modulation circuit of claim 17 wherein the range is between $(1-\alpha/2)$ and $\alpha/2$.

19. The pulse width modulation circuit of claim 17 wherein the logic circuit is configured to base the adjustable output signal on: the first but not the second pulse signal when the duty cycle is below the range; and on the second but not the first pulse signal when the duty cycle is above the range.

20. The pulse width modulation circuit of claim 19 wherein the logic circuit is configured to base the adjustable output signal on a periodic transition in the periodic reference signal when the duty cycle is outside of the range.

21. The pulse width modulation circuit of claim 17 wherein the periodic reference signal includes two periodic quadrature reference signals and wherein the logic circuit is configured to receive and process the two periodic quadrature reference signals.

22. A pulse width modulation circuit for generating an adjustable output signal that periodically transitions between a first and a second state with an adjustable duty cycle comprising:

a first pulse generator circuit configured to generate a first pulse signal that periodically transitions at an adjustable delay with respect to a periodic reference signal;

a second pulse generator circuit configured to generate a second pulse signal that periodically transitions at an adjustable delay with respect to the periodic reference signal; and a logic circuit configured to generate the adjustable output signal based on both the first and the second pulse signals, wherein the pulse width modulation circuit is a slave pulse width modulation circuit, and further comprising a master pulse width modulation circuit configured to generate an adjustable output signal that periodically transitions between a first and a second state with an controllable duty cycle at a frequency different from the frequency of the periodic transitions of the slave pulse width modulation circuit, the master pulse width modulation circuit being part of a feedback loop which produces a duty cycle output which sets the duty cycle of the master pulse width modulation circuit based on a reference signal, the duty cycle output also being configured to synchronously control the duty cycle of the slave pulse width modulation circuit.

23. The pulse width modulation circuit of claim 22 wherein the frequency of the periodic transitions of the slave pulse width modulation circuit is adjustable and less than the frequency of the periodic transitions of the master width modulation circuit.

24. The pulse width modulation circuit of claim 22 wherein the frequency of the periodic transitions of the slave pulse width modulation circuit is greater than the frequency of the periodic transitions of the master width modulation circuit.

* * * * *